US008961736B2

(12) United States Patent
Choi

(10) Patent No.: US 8,961,736 B2
(45) Date of Patent: Feb. 24, 2015

(54) PLASMA REACTOR WITH INTERNAL TRANSFORMER

(75) Inventor: Dae-Kyu Choi, Gyeonggi-do (KR)

(73) Assignee: New Power Plasma Co., Ltd., Gyeonggi-do (KR)

( * ) Notice: Subject to any disclaimer, the term of this patent is extended or adjusted under 35 U.S.C. 154(b) by 1584 days.

(21) Appl. No.: 12/125,948

(22) Filed: May 23, 2008

(65) Prior Publication Data

US 2009/0291027 A1 Nov. 26, 2009

(30) Foreign Application Priority Data

May 20, 2008 (KR) ........................ 10-2008-0046769

(51) Int. Cl.

*H01L 21/306* (2006.01)
*C23C 16/00* (2006.01)
*H05H 1/46* (2006.01)

(52) U.S. Cl.

CPC ........................................ *H05H 1/46* (2013.01)
USPC ............... 156/345.48; 118/723 IR; 118/723 I

(58) Field of Classification Search

CPC ................ H01J 37/321; H01J 37/3211; H01J 37/32119; H01J 37/32128; H01J 37/32137; H01J 37/32146; H01J 37/32155; H01J 37/32165; H01J 37/32174; H01J 37/32183
USPC ....... 118/723 I, 723 IR, 723 AN; 156/345.48, 156/345.49; 315/111.51
See application file for complete search history.

(56) References Cited

U.S. PATENT DOCUMENTS 5,998,933 A * 12/1999 Shun'ko .................. 315/111.51
6,392,351 B1 * 5/2002 Shun'ko .................. 315/111.51
6,815,899 B2 * 11/2004 Choi ........................ 315/111.21
6,855,906 B2 * 2/2005 Brailove .................. 219/121.36
2007/0245963 A1 * 10/2007 Choi .......................... 118/723.1

* cited by examiner

*Primary Examiner* — Luz Alejandro Mulero
(74) *Attorney, Agent, or Firm* — IP & T Group LLP

(57) ABSTRACT

There is provided a plasma reactor with an internal transformer. The plasma reactor comprises: a plasma chamber with a gas inlet and a gas outlet, for providing a plasma discharging space; one or more core cylinder jackets for providing a core storage space in the plasma discharging space and forming a plasma centralized channel and a plasma decentralized channel by including one or more through-apertures; and one or more transformers each including a magnetic core with primary winding surrounding the through-aperture and installed in the core storage space, wherein the plasma discharging space comprises one or more first spatial regions to form the plasma centralized channel and one or more second spatial regions to form the plasma decentralized channel. In the plasma reactor, since the transformer is installed in the plasma chamber, energy is transferred with almost no loss from the transformer to the plasma discharging space and therefore the energy transfer efficiency is very high. Then, since most of gases flow through the first spatial region and the through-aperture inside the plasma chamber, most of active gases are generated in the plasma centralized channel. Consequently, the plasma reactor is very suitable for generating large amount of active gases. Further, even though the plasma chamber is composed of a conductive material, since no special insulating region needs to be formed, it is very easy to constitute the plasma chamber. Further, since the plasma chamber itself is sufficiently capable of forming an outer case, the plasma reactor is very simply manufactured.

36 Claims, 23 Drawing Sheets

PLASMA REACTOR WITH INTERNAL TRANSFORMER

CROSS-REFERENCE TO RELATED APPLICATION

This application claims the benefit of Korean Patent Application No. 10-2008-46796, filed May 20, 2008, the disclosure of which is hereby incorporated herein by reference in its entirety.

BACKGROUND OF THE INVENTION

1. Technical Field

The present invention relates to a plasma reactor for generating an active gas including ions, free radicals, atoms and molecules by plasma discharging and performing plasma processing of a solid, powder, gas or the like by using the active gas and, more particularly, to a multi-path inductively coupled plasma.

2. Discussion of Related Art

Plasma discharge is used for gas excitation to generate an active gas including ions, free radicals, atoms and molecules. An active gas is widely used in various fields. An active gas is generally used in semiconductor fabrication processes, for example, such as etching, deposition, cleaning, ashing and the like.

A wafer for fabricating a semiconductor device or an LCD glass substrate becomes lager. Accordingly, a plasma source needs to have high capability of controlling plasma ion energy and to have easy expandability with large-area processing capability.

Types of plasma sources for generating plasma are diverse. Typical examples of plasma sources using radio frequency include capacitively coupled plasma and inductively coupled plasma. It is known that the inductively coupled plasma is suitable for obtaining high-density plasma since it is capable of relatively easily increasing the ion density as radio frequency power increases.

However, in the type of inductively coupled plasma, a high-voltage driving coil is used because the energy binding with plasma is low compared with the energy as supplied. Consequently, since the ion energy is high, the inside surface of a plasma reactor may be damaged by ion bombardment. The damage to the inside surface of a plasma reactor by the ion bombardment not only shortens the life of the plasma reactor but also influences as a pollution source of plasma processing, resulting in a negative output. When decreasing the ion energy, since the energy binding with plasma is low, plasma discharging may be off. Therefore, in the inductively coupled plasma, it is difficult to stably keep plasma.

Meanwhile, remote plasma is very usefully applied in a process of using plasma in the semiconductor fabrication process. For example, the remote plasma is usefully used in a cleaning process of a process chamber or an ashing process for photoresist strip. However, since the volume of a process chamber increases as a substrate to be processed becomes larger, a plasma source needs to remotely supply a sufficient amount of high-density active gas.

To generate high-density plasma in a great quantity, the volume of a plasma reactor needs to increase. In most remote plasma reactors, the reactor is generally installed at an upper position of a process chamber. Then, when the size of the reactor increases, it is not easy to install the reactor. Moreover, in the plasma reactor having the structure in that a magnetic core forming a transformer is wound around the plasma chamber, called the toroidal structure, one or more insulating regions are included to interrupt an eddy current from generating in the plasma chamber. The plasma chamber having the aforementioned separate structure may have the problem of lowering the security and coherence in installing a large-volume plasma reactor. Moreover, when a radio frequency generator and a plasma reactor are constituted in a single unit like a conventional technique, it is more likely to have the aforementioned problem.

SUMMARY OF THE INVENTION

Therefore, the present invention is directed to provide a plasma reactor with an internal transformer which is capable of more firmly and easily constituting a plasma chamber by including no insulating region in the plasma chamber, and which is capable of stably generating large amount of plasma by raising the efficiency of transferring energy.

In accordance with an aspect of the present invention, there is provided a plasma reactor comprising: a plasma chamber with a gas inlet and a gas outlet, for providing a plasma discharging space; one or more core cylinder jackets for providing a core storage space in the plasma discharging space and forming a plasma centralized channel and a plasma decentralized channel by including one or more through-apertures; and one or more transformers each including a magnetic core with primary winding surrounding the through-aperture and installed in the core storage space, and wherein the plasma discharging space comprises one or more first spatial regions to form the plasma centralized channel and one or more second spatial regions to form the plasma decentralized channel.

In an exemplary embodiment, the first spatial region may comprise an inner side of the plasma chamber and a side of the core cylinder jacket opposing to the side of the plasma chamber by a first gap, the second spatial region may comprise another side of the plasma chamber and another side of the core cylinder jacket opposing to the side of the plasma chamber by a second gap, and the second gap may have a smaller value than the first gap.

In an exemplary embodiment, the first spatial region and the second spatial region may comprise a spacer block between the first and second spatial regions.

In an exemplary embodiment, the plasma chamber may comprise a cooling channel.

In an exemplary embodiment, the core cylinder jacket may comprise a cooling channel.

In an exemplary embodiment, the plasma reactor may further comprise: one or more than one connection bridges in a tube structure connected between the plasma chamber and the core cylinder jacket, for operatively connecting the outside of the plasma chamber to the core storage space.

In an exemplary embodiment, the plasma reactor may further comprise: a cooling unit for supplying cooling water or cooling wind to the core storage space through the connection bridge.

In an exemplary embodiment, the plasma reactor may further comprise: one or more discharging inducing blocks positioned between the plasma chamber and the core cylinder jacket, for defining the plasma discharging channel within the plasma discharging space.

In an exemplary embodiment, the core cylinder jacket and the plasma chamber may be composed of a conductive material but electrically insulated from each other and as the transformer is driven with the electrically grounded plasma chamber, the core cylinder jacket and the plasma chamber may generate a potential difference.

In an exemplary embodiment, the plasma reactor may further comprise: an ignition electrode for generating free charges assisting an ignition of plasma toward the plasma discharging space.

In an exemplary embodiment, the plasma reactor may further comprise: an ultraviolet source optically connected to the plasma discharging space, for generating free charges assisting an ignition of plasma.

In an exemplary embodiment, the plasma reactor may further comprise: an ignition maintenance electrode positioned in the plasma discharging channel, for generating free charges assisting an ignition and maintenance of plasma.

In an exemplary embodiment, the plasma reactor may further comprise: one or more switching semiconductor devices; and an AC switching power supply source for generating radio frequency and supplying the radio frequency to the one or more than one transformers.

In an exemplary embodiment, the one or more switching semiconductor devices may comprise one or more switching transistors.

In an exemplary embodiment, the AC switching power supply source may drive the two or more transformers in series or in parallel.

In an exemplary embodiment, the plasma reactor may further comprise: a measurement circuit for measuring an electrical or optical parameter value related to at least one of the primary winding of the transformer and the plasma generated inside the plasma discharging space; and a power control circuit for controlling a voltage and a current supplied to the primary winding of the transformer, by controlling an operation of the AC switching power supply source based on the electrical or optical parameter value measured by the measurement circuit.

In an exemplary embodiment, the plasma reactor may further comprise: one or more switching semiconductor devices; and two or more AC switching power supply sources for generating radio frequency and supplying the radio frequency to their corresponding one of the one or two or more transformers.

In an exemplary embodiment, the one or more switching semiconductor devices may comprise one or more switching transistors.

In an exemplary embodiment, the plasma reactor may further comprise: a measurement circuit for measuring an electrical or optical parameter value related to at least one of the primary winding of the transformer and the plasma generated inside the plasma discharging space; and a power control circuit for controlling a voltage and a current supplied to the primary winding of the transformer, by controlling an operation of the AC switching power supply source based on the electrical or optical parameter value measured by the measurement circuit.

In an exemplary embodiment, the first spatial region may comprise the two or more through-apertures, the second spatial region may comprise a side of the plasma chamber and a side of the core cylinder jacket opposing to the side of the plasma chamber by a gap, and the gap of the second spatial region may have a smaller value than the inner diameter of each of the two through-apertures.

In an exemplary embodiment, the gas inlet may comprise two or more separate gas inlets.

In an exemplary embodiment, the two or more separate gas inlets may be a first gas inlet for supplying a reactive gas and a second gas inlet for supplying a noble gas.

In an exemplary embodiment, the plasma reactor may further comprise: a porous gas intake plate positioned at the gas inlet, for distributing the gas to flow into the plasma chamber.

In an exemplary embodiment, the gas outlet may comprise two or more separate gas outlets.

In an exemplary embodiment, the gas inlet and the gas outlet may be structured to be aligned toward the plasma centralized channel.

In an exemplary embodiment, the core cylinder jacket may be composed of a conductive material but include one or more electrically insulating region to form electrical discontinuity within the conductive material.

In an exemplary embodiment, at least one of the plasma chamber and the core cylinder jacket may be composed of a conductive material.

In an exemplary embodiment, the conductive material may be any one of aluminum and a compound material (resulting from a covalent bond of carbon nanotube and aluminium).

In an exemplary embodiment, at least one of the plasma chamber and the core cylinder jacket may be composed of an insulating material.

In an exemplary embodiment, the insulating material may include quartz.

In an exemplary embodiment, the plasma reactor may further comprise: a process chamber for receiving plasma generated in the plasma chamber; and an adapter connected between a plasma inlet of the process chamber and the gas outlet of the plasma chamber.

In an exemplary embodiment, the plasma reactor may further comprise: a cooling channel mounted inside the adapter.

In an exemplary embodiment, the adapter may comprise one or more gas inlets not passing through the plasma chamber.

In an exemplary embodiment, the adapter may comprise a window for measuring an optical parameter of plasma.

In an exemplary embodiment, the plasma reactor may further comprise: a diffuser positioned under the plasma inlet inside the process chamber, for diffusing plasma flowing into the plasma chamber.

In an exemplary embodiment, the plasma reactor may further comprise: a baffle plate positioned under the plasma inlet inside the process chamber, for diffusing the plasma flowing into the plasma chamber.

In an exemplary embodiment, the plasma reactor may further comprise: a power supply unit for supplying radio frequency to drive the one or more than one transformers, and wherein the power supply unit is structured to be physically separated from the plasma chamber, and a power output terminal of the power supply unit and a power input terminal connected to the primary windings of the one or more than one transformers are remotely connected by a radio frequency supply cable.

In accordance with the plasma reactor with the internal transformer of the present invention, since the transformer is installed in the plasma chamber, energy is transferred with almost no loss from the transformer to the plasma discharging space and thus the energy transfer efficiency is very high. Therefore, the plasma reactor is very suitable for generating large amount of active gases. Further, even though the plasma chamber is composed of a conductive material, since no special insulating region needs to be formed, it is very easy to constitute the plasma chamber. Further, since the plasma chamber itself is sufficiently capable of forming an outer case, the plasma reactor is very simply manufactured. When two or more transformers are used, relatively large amount of active gas is generated. Further, the plasma reactor with the internal transformer(s) can be effectively used when supplying the active gas to the process chamber through a number of gas outlets. Further, since the plasma reactor uses a number of low-capacity transformers, it is capable of preventing many problems that may be caused when one high-capacity transformer is used.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
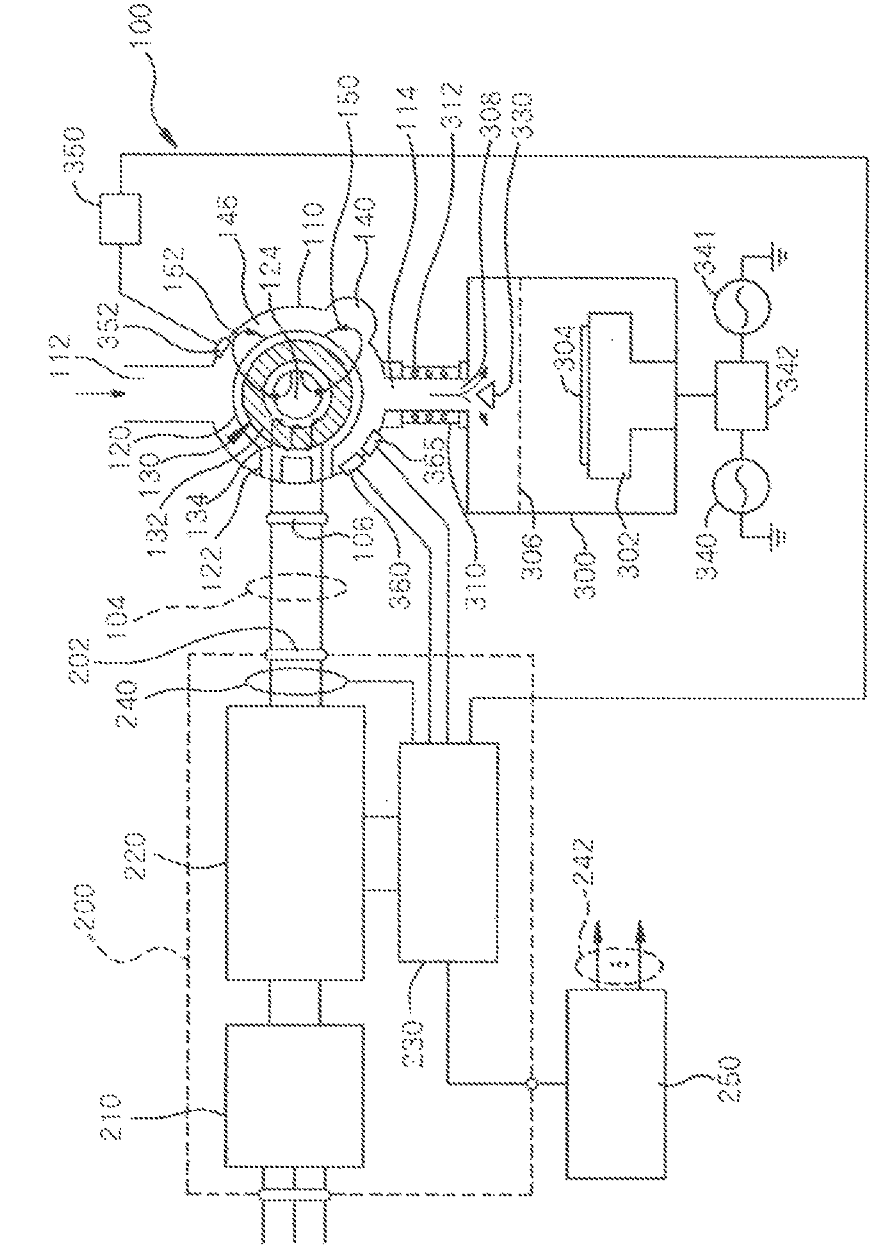
FIG. 1 is a view illustrating a plasma processing apparatus comprising a plasma reactor according to a preferred embodiment of the present invention.

The present invention will now be described more fully hereinafter with reference to the accompanying drawings, in which preferred embodiments of the invention are shown. This invention may, however, be embodied in many different forms and should not be construed as being limited to the exemplary embodiments set forth herein. Rather, these embodiments are provided so that this disclosure will be through and complete, and will fully convey the scope of the invention to those skilled in the art.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. In the drawings, the shapes of elements may be exaggerated for clarity. Like numbers refer to like elements throughout the specification. Where the function and constitution are well-known in the relevant arts, further discussion will not be presented in the detailed description of the present invention in order not to unnecessarily make the gist of the present invention unclear.

Exemplary Embodiment 1

FIG. 1 illustrates a plasma processing apparatus including a plasma reactor 100 according to a preferred embodiment of the present invention.

Referring to FIG. 1, the plasma reactor 100 comprises a plasma chamber 110 in which a transformer 130 is installed. The plasma chamber 110 provides a plasma discharging space with a gas inlet 112 and a gas outlet 114. A core cylinder jacket 120 to provide a core storage space is included in the plasma chamber 110. The core cylinder jacket 120 is spaced apart from an inside wall of the plasma chamber 110 and is connected to the plasma chamber 110 through a connection bridge 122. The core storage space of the core cylinder jacket 120 is operatively connected to the outside of the plasma chamber 110 through the connection bridge 122. The transformer 130 is installed in the core storage space of the core cylinder jacket 120. The transformer 130 includes a magnetic core 132 with a primary winding 134. The magnetic core 132 is installed in the core storage space, surrounding a through-aperture 124 of the core cylinder jacket 120. The primary winding 134 is extended outside the plasma chamber 110 through the connection bridge 122, to be electrically connected to a power supply unit 200 supplying radio frequency. The gas outlet 114 of the plasma chamber 110 is connected to a process chamber 300 through an adapter 310.

The core cylinder jacket 120 includes the through-aperture 124 and forms plasma centralized and decentralized channels 150 and 152 passing through the through-aperture 124 in the plasma discharging space of the plasma chamber 110. The plasma discharging space is divided into a number of spatial regions by the core cylinder jacket 120. One is a first spatial region 140 for forming the plasma centralized channel 150, and the other is a second spatial region 146 for forming the plasma decentralized channel 152. The first spatial region 140 includes a side of the plasma chamber 110 and a side of the core cylinder jacket 120 which oppose to each other and are spaced apart from each other by a first gap. The second spatial region 146 includes another side of the plasma chamber 110 and another side of the core cylinder jacket 120 which oppose to each other and are spaced apart from each other by a second gap. The first gap has a greater value than the second gap. The inner diameter of the through-aperture 124 has a greater value than the second gap. The plasma centralized channel 150 and the plasma decentralized channel 152 share the through-aperture 124 of the core cylinder jacket 120.

When a process gas is supplied from a gas supply source (not shown) to the plasma reactor 100 and the radio frequency is supplied from the power supply unit 200 to the transformer 130, plasma is generated in the discharging space inside the plasma chamber 110. An active gas generated inside the plasma chamber 110 by the generation of plasma is provided to the process chamber 300 through the adapter 310 connected to the gas outlet 114. Then, since most gas flows through the first spatial region 140 and the through-aperture 124 in the plasma chamber 110, most of the active gas is generated in the plasma centralized channel 150.

In the plasma reactor 100 described above, since the transformer 130 is installed in the plasma chamber 110 and therefore the energy is transferred with almost no loss from the transformer 130 to the plasma discharging space, the energy transfer efficiency is very high. Accordingly, the plasma reactor 100 is very suitable for generating large amount of active gas. Furthermore, even though the plasma chamber 110 is formed using a conductive material, since no separate insulating regions need to be formed, it is very easy to constitute the plasma chamber 110. Furthermore, since the plasma chamber 110 itself is sufficiently capable of forming an outer case, it is very easy to manufacture the plasma reactor 100.

When the core cylinder jacket 120 and the plasma chamber 110 are constituted including a conductive material, the core cylinder jacket 120 and the plasma chamber 110 are constituted to be electrically insulated. In this structure, as the transformer 130 is driven with the electrically grounded plasma chamber 110, a potential difference occurs between the core cylinder jacket 120 and the plasma chamber 110. The potential difference generates capacitively coupled plasma resulted from the potential difference occurred between the plasma chamber 110 and the core cylinder jacket 120. That is, the inductively coupled plasma by the transformer 130 and the capacitively coupled plasmas by the potential difference between the plasma chamber 110 and the core cylinder jacket 120 are generated in combination inside the plasma discharging chamber 110.

Figure 2:
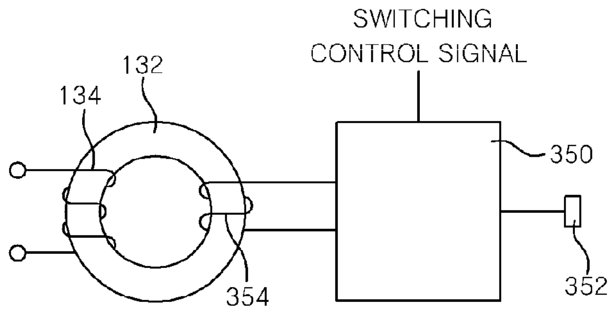
FIG. 2 is a view illustrating an example of the constitution of an ignition circuit.

The plasma reactor 100 may comprise an ignition electrode 352 generating free charges which assist an ignition of plasma in the plasma discharging space inside the plasma chamber 110. The ignition electrode 352 is driven by receiving power for generating the free charges through an ignition circuit 350. For example, as illustrated in FIG. 2, the ignition circuit 350 is electrically connected to an ignition power induction coil 354 which is wound about the magnetic core 132 of the transformer 130, to receive the ignition power as supplied and to drive the ignition electrode in a plasma ignition operation section based on a switching control signal (which is provided from a control circuit 230 included in the power supply unit 200).

A method for supplying the power for ignition may be modified in various ways. Further, a method for igniting the plasma reactor 100 may be modified in another form. For example, the plasma reactor 100 may include an ultraviolet source which is optically connected to the plasma discharging space and which generates the free charges for assisting an ignition of plasma. Or the plasma reactor 100 may not additionally include the ignition electrode 352. For example, the free charges which assist an ignition of plasma can be generated by forming the second gap to be sufficiently narrow in the second spatial region 146 forming the plasma decentralized channel 152.

The primary winding 134 of the transformer 130 is electrically connected to the power supply unit 200 for supplying the radio frequency. The power supply unit 200 comprises one or more switching semiconductor devices and includes an AC switching power supply source 220 for generating the radio frequency, the power control circuit 230 and a voltage supply source 210. The one or more switching semiconductor devices include, for example, one or more switching transistors.

The voltage supply source 210 converts an alternating current provided from the outside into a constant voltage to be supplied to the AC switching power supply source 220. The AC switching power supply source 220 is operated by control of the power control circuit 230, to generate and output the radio frequency through a power output terminal 202 to drive the transformer 130. The power control circuit 230 controls the operation of the AC switching power supply source 220, to control the voltage and current supplied to the primary winding 134 of the transformer 130.

The control of the power control circuit 230 is based on an electrical or optical parameter value related to at least one of the primary winding 134 of the transformer 130 and the plasma generated inside the plasma chamber 110. For this purpose, a measurement circuit 240 is included to measure the electrical or optical parameter value related to at least one of the primary winding 134 of the transformer 130 and the plasma generated inside the plasma discharging space.

For example, the measurement circuit 240 for measuring the electrical and optical parameters of plasma includes a current probe 360 and an optical detector 365. The measurement circuit 240 for measuring the electrical parameter of the primary winding 134 measures a driving current of the primary winding 134, a voltage at a terminal of the primary winding 134, a voltage generated in the voltage supply source 210, the average power and maximum power of the primary winding 134. The power control circuit 230 continuously monitors the electrical or optical parameter value related to the primary winding 134 and the plasma generated inside the plasma chamber 110 through the measurement circuit and compares the measure value with a standard value based on the normal operation, to control the AC switching power supply source 220 to control the voltage and current supplied to the primary winding 134.

The plasma reactor 100 comprises a protection circuit for preventing any damage that may be caused by the abnormal operation environments, and a cooling unit for preventing overheat of the plasma reactor 100.

The power supply unit 200 is connected to a system control unit 250 for controlling the overall plasma processing system. The power supply unit 200 provides the operation state of the plasma reactor 100 to the system control unit 250. The system control unit 250 generates a control signal 242 for controlling the overall plasma processing system, thereby controlling the operation of the process chamber 300 while the plasma reactor 100 operates.

The power supply unit 200 is physically separated from the plasma chamber 110 in structure. The power output unit 202 of the power supply unit 200 and a power input unit 106 connected to the primary winding 134 of the transformer 130 are remotely connected to each other by a radio frequency supply cable 104. This separate structure makes it easy to maintain and install the plasma reactor 100. However, the power supply unit 200 and the plasma chamber 110 may be constituted in a physically single unit.

The plasma generated in the plasma chamber 110 is output to the process chamber 300 and received in the process chamber 300. The gas outlet 114 of the plasma chamber 110 is connected to a plasma inlet 308 of the process chamber 300 through the adapter 310. Preferably, the adapter 310 may include an electrically insulating region so that the plasma chamber 110 is electrically insulated from the process chamber 300. The adapter 310 may include a cooling channel 312 for preventing overheating. The adapter 310 may include one or more gas inlets (not shown) which do not pass through the plasma chamber 110. The adapter 310 may include a window (not shown) for measuring the optical parameter of the plasma flowing into the plasma chamber 300.

A diffuser 330 installed under the plasma inlet 308 may be included inside the process chamber 300, to diffuse the plasma into the plasma chamber 300. A baffle plate 306 may be included at an upper position inside the process chamber 300. The baffle plate 306 is installed under the plasma inlet 308, to diffuse the plasma flowing into the plasma chamber 300.

A substrate support bed 302 is included inside the process chamber 300, to support a substrate 304 to be processed. The substrate 304 to be processed is, for example, a silicon wafer substrate for fabricating a semiconductor device or a glass substrate for manufacturing an LCD display, a plasma display or the like. The substrate support bed 302 may be connected to one or more than one bias power supply sources 340 and 341, to be a single bias or multi-bias.

Figure 3:
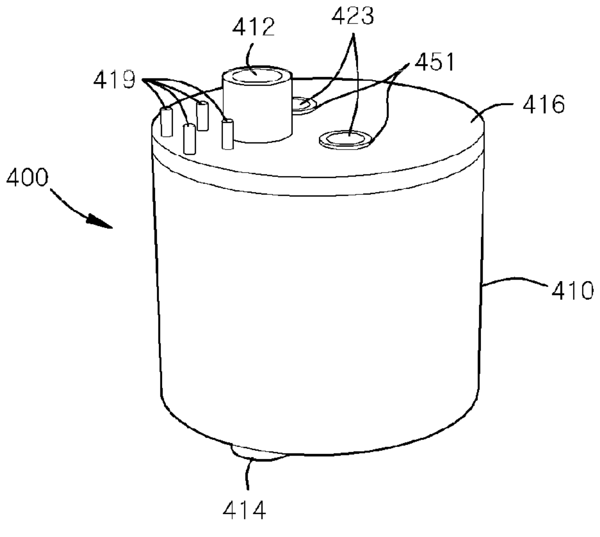
FIG. 3 is a perspective view illustrating a plasma chamber according to a modified example of the embodiment of FIG. 1.
Figure 4:
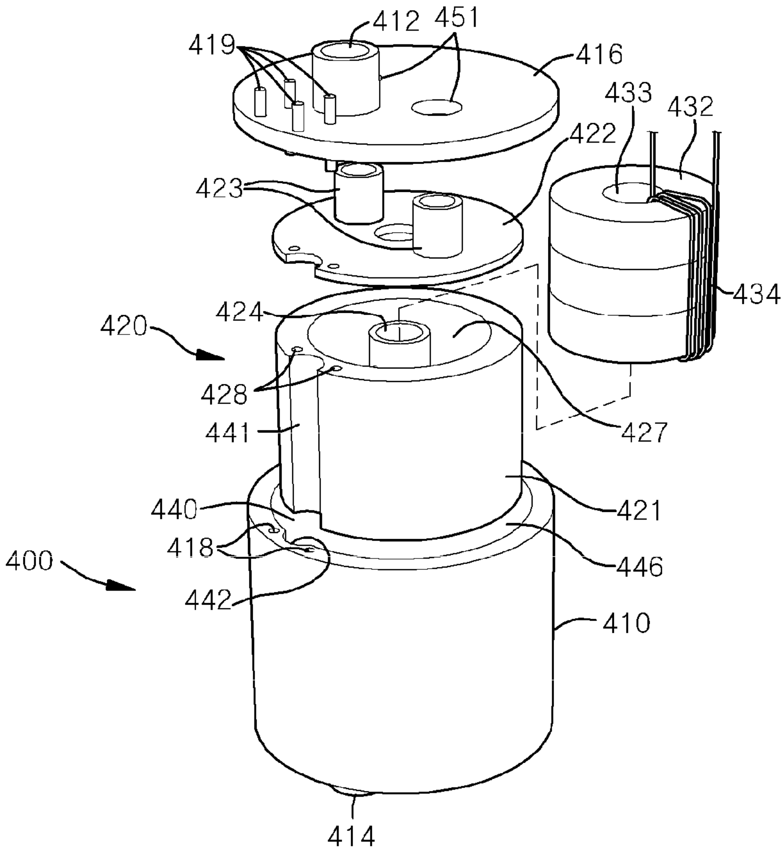
FIG. 4 is an exploded perspective view illustrating the main constitution of the plasma chamber of FIG. 3 according to the modified example.

FIG. 3 is a perspective view illustrating a plasma chamber 400 according to a modified example of the embodiment of FIG. 1, and FIG. 4 is an exploded perspective view of the main constitution of the plasma chamber 400 of FIG. 3.

Referring to FIGS. 3 and 4, the plasma chamber 400 according to an embodiment of the present invention comprises a chamber body 410 for providing the plasma discharging space, and a chamber cover 416. The chamber body 410 and the chamber cover 416 are combined together vacuum-insulated by an O-ring (not shown). Since the plasma chamber 400 has the structure in which a transformer 430 is installed, even though the chamber body 410 and the chamber cover 416 are formed of a metal material, any special insulating region are not needed. A gas inlet 412 is formed in the chamber cover 416, and a gas outlet 414 is formed at the bottom of the chamber body 410. Two bridge connection openings 451 connected to connection bridges 423 of a core cylinder jacket 420 are formed in the chamber cover 416.

A core cylinder jacket 420 is installed in the plasma chamber 400. The core cylinder jacket 420 includes a jacket body 421 and a jacket cover 422. The jacket body 421 and the jacket cover 422 are combined together to form vacuum and to be electrically insulated by an O-ring 472 and an insulation ring 473, which will be described with reference to FIGS. 12 through 18 later. When the core cylinder jacket 420 is formed of a conductive material, the insulation ring 473 has the function of the insulating region with electrical discontinuity, to interrupt the generation of an eddy current in the core cylinder jacket 420. The jacket body 421 includes a through-aperture 424 which penetrating a core storage space 427 vertically. A magnetic core 432 forming the transformer 430 is installed in the manner that a core opening 433 receives the through-aperture 424.

The core cylinder jacket 420 includes one or more than one connection bridges 423. For example, two connection bridges 423 are formed in the jacket cover 422, and the connection bridges 423 are connected to the bridge connection openings 451 formed in the chamber cover 416. The connection bridges 423 and the bridge connection openings 451 are vacuum-insulated by the O-ring (not shown). The connection bridges 423 keep the core cylinder jacket 420 in the plasma discharging space inside the plasma chamber 400 while maintaining a predetermined gap. The connection bridge 423 has a tube structure so that the outside of the plasma chamber 400 is operatively connected to the core storage space 427. A primary winding 434 of the transformer 430 is extended to the outside of the plasma chamber 400, through the two connection bridges 423, so as to be electrically connected to a power supply source (not shown).

Figure 5:
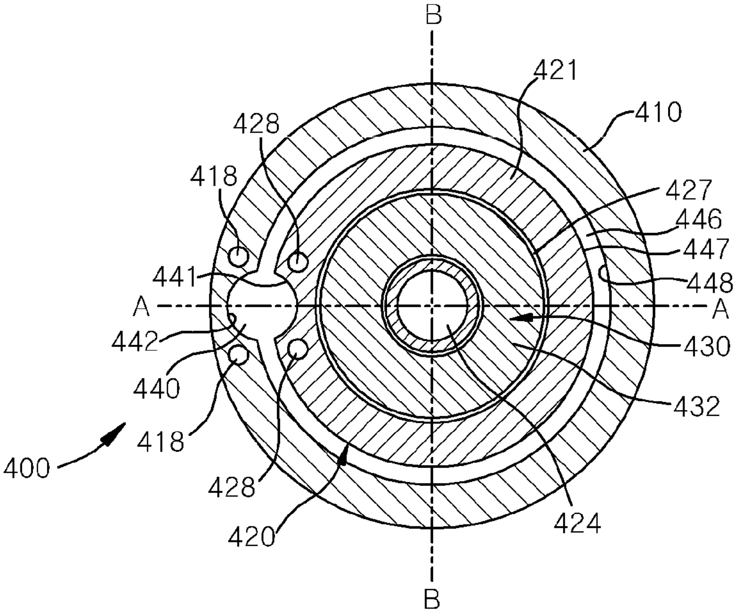
FIG. 5 is a horizontal sectional view illustrating the plasma chamber of FIG. 3.
Figure 6:
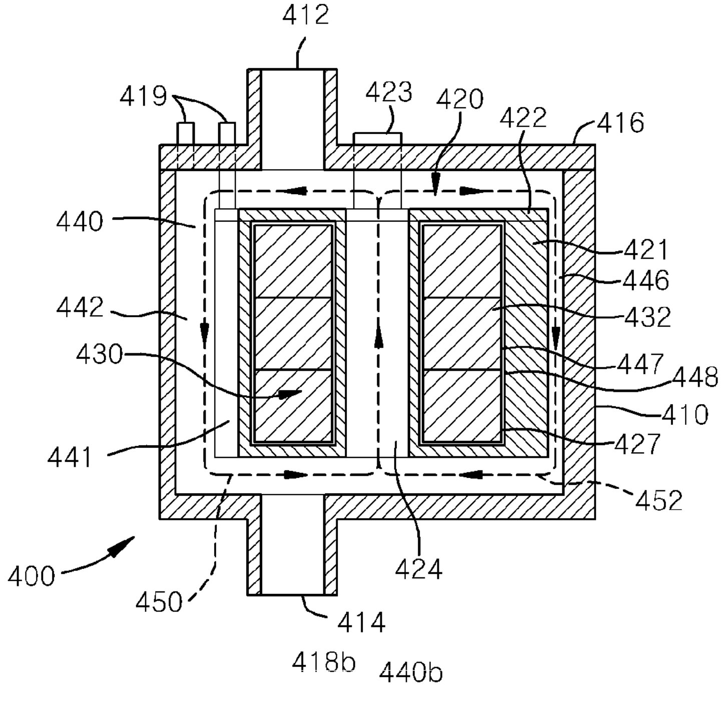
FIG. 6 is a vertical sectional view illustrating of the plasma chamber, taken along line A-A of FIG. 5.

FIG. 5 is a horizontal sectional view of the plasma chamber 400 of FIG. 3, and FIG. 6 is a vertical sectional view of the plasma chamber 400, taken along line A-A of FIG. 5.

Referring to FIGS. 5 and 6, the core cylinder jacket 420 is installed to be spaced apart from the inner surface of the plasma chamber 400 by a gap, thereby forming a plasma centralized channel 450 and a plasma decentralized channel 452 which pass through the through-aperture 424 in the plasma discharging space. The plasma discharging space is divided into two spatial regions by the core cylinder jacket 420. One is a first spatial region 440 for forming the plasma centralized channel 450 and the other is a second spatial region 446 for forming the plasma decentralized channel 452.

The first spatial region 440 for forming the plasma centralized channel 450 includes a side 442 of the plasma chamber 400 and a side 441 of the core cylinder jacket 420, wherein the plasma chamber 400 and the core cylinder jacket 420 oppose to each other by a first gap. The side 442 of the plasma chamber 400 and the side 441 of the core cylinder jacket 420 form the first spatial region 440 in an overall cylindrical structure which is hollow. The first gap of the first spatial region 440 (which is substantially the inner diameter of the hollow cylindrical structure) may be formed to be same as or smaller than the inner diameter of the through-aperture 424 of the core cylinder jacket 420. The plasma centralized channel 450 is formed by passing through the first spatial region 440 and the through-aperture 424.

The second spatial region 446 for forming the plasma decentralized channel 452 includes another side 448 of the plasma chamber 400 and another side 447 of the core cylinder jacket 420, wherein the plasma chamber 400 and the core cylinder jacket 420 oppose to each other by a second gap. The second gap has a smaller value than the first gap. The plasma decentralized channel 452 is formed by passing through the second spatial region 446 and the through-aperture 424. The second spatial region 446 substantially corresponds to the rest excluding the first spatial region 440 in the inside wall of the plasma chamber 400 and the outside wall of the core cylinder jacket 420.

Since the gap of the second spatial region 446 is relatively narrower than that of the first spatial region 440, most of a gas substantially flows through the first spatial region 440 and the through-aperture 424 inside the plasma chamber 400, and most of an active gas is generated in the plasma centralized channel 450.

As illustrated in FIG. 6, the gas inlet 412 and gas outlet 414 formed in the plasma chamber 400 are positioned towards the plasma centralized channel 450. That is, since the plasma centralized channel 450 is positioned between the gas inlet 412 and the gas outlet 414, the gas flowing through the gas inlet 412 is mostly distributed to flow through the first spatial region 440 and the through-aperture 424. Therefore, the active gas generated through the plasma centralized channel 450 is provided to a process chamber 300 through an adapter 310 connected to the gas outlet 414.

Figure 7:
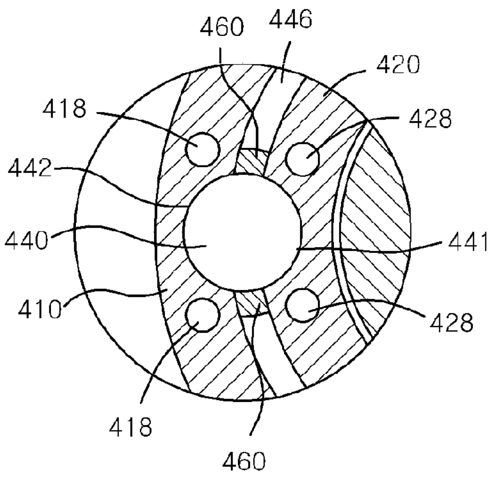
FIG. 7 is a view illustrating an example of the constitution of a dielectric barrier around a plasma centralized channel.

FIG. 7 illustrates an example of constituting a dielectric barrier around the plasma centralized channel 450.

Referring to FIG. 7, a spacer block 460 may be installed between the first spatial region 440 and the second spatial region 446 in the discharging region inside the plasma chamber 400, to more securely form the plasma centralized channel 450. The spacer block 460 is installed to be inserted between the inner surface of the plasma chamber 400 and the outer surface of the core cylinder jacket 420, at the boundary between the first spatial region 440 and the second spatial region 446. Preferably, the spacer block 460 may be formed of an insulating material, such as ceramics.

The plasma chamber 400 and the core cylinder jacket 420 each include cooling channels 418 and 428. The cooling channels 418 and 428 are connected to a number of cooling water injection/exhaust openings 419 included in the chamber cover 416. Cooling water circulates the cooling channels 418 and 428, to cool the overheated plasma chamber 400 and core cylinder jacket 420. Preferably, the cooling channels 418 and 428 may be installed around the first spatial region 440 forming the plasma centralized channel 450 but it may be additionally installed at the other positions if needed.

Figure 8:
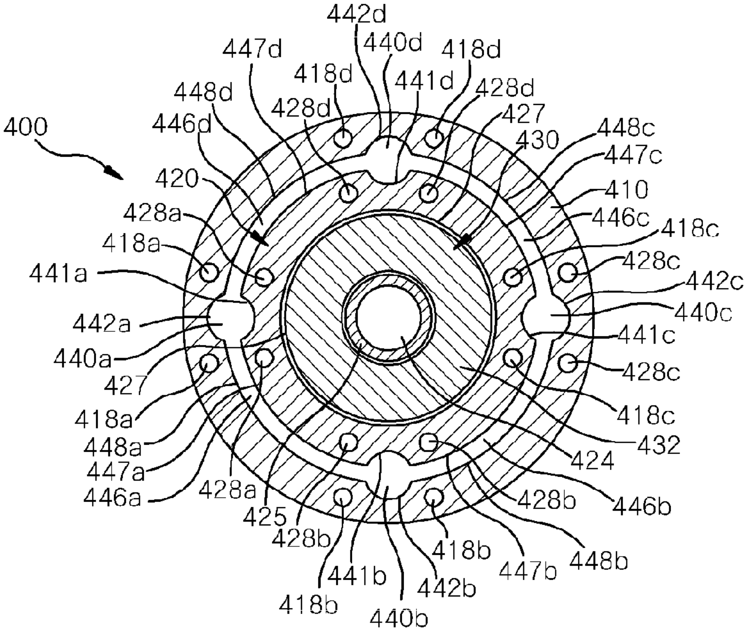
FIG. 8 is a view illustrating an example of the constitution of a plurality of plasma centralized channels inside the plasma chamber.

FIG. 8 illustrates a modified example of including a plurality of the plasma centralized channels inside the plasma chamber 400 according to the embodiment of the present invention.

Referring to FIG. 8, a discharging region inside the plasma chamber 400 is divided into a plurality of first spatial regions 440*a*, 440*b*, 440*c* and 440*d* to form a plurality of the plasma centralized channels. Therefore, plasma decentralized channels are also formed through a plurality of second spatial regions 446*a*, 446*b*, 446*c* and 446*d*. The first spatial regions 440*a*, 440*b*, 440*c* and 440*d* each include sides 442*a*, 442*b*, 442*c* and 442*d* of the plasma chamber 400 and 441*a*, 441*b*, 441*c* and 441*d* of the core cylinder jacket 420, wherein the plasma chamber 400 and the core cylinder jacket 420 oppose to each other. The second spatial regions 446*a*, 446*b*, 446*c* and 446*d* each include other sides 448*a*, 448*b*, 448*c* and 448*d* of the plasma chamber 400 and other 447*a*, 447*b*, 447*c* and 447*d* of the core cylinder jacket 420. Further, a number of cooling cannels 418*a*, 428*a*, 418*b*, 428*b*, 418*c*, 428*c*, 418*d* and 428*d* are formed around the first spatial regions 440*a*, 440*b*, 440*c* and 440*d* in the plasma chamber 400 and the core cylinder jacket 420.

Figure 9:
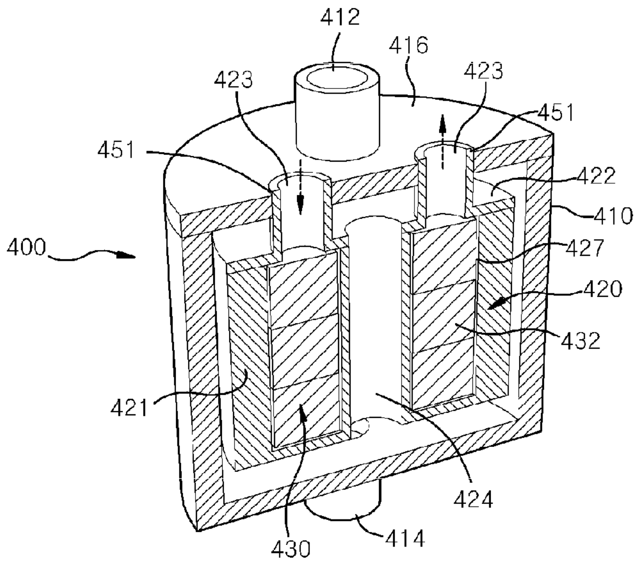
FIG. 9 is a vertical sectional view of the plasma chamber, taken along line B-B of FIG. 4.
Figure 10:
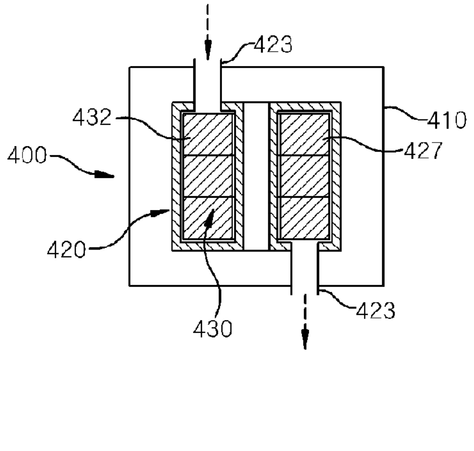
FIGS. 10 and 11 are views illustrating modified examples of a method for securing a core cylinder jacket.
Figure 11:
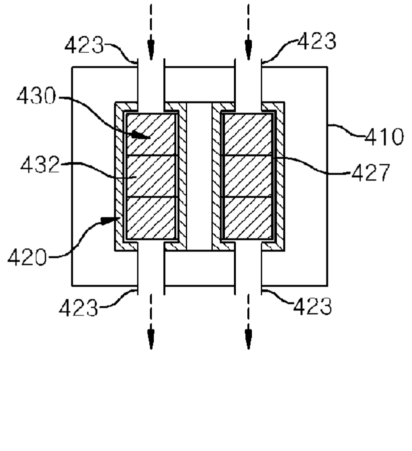

FIG. 9 is a vertical sectional view of the plasma chamber 400 taken along line B-B of FIG. 5, and FIGS. 10 and 11 illustrate modified examples of a method for securing the core cylinder jacket 420.

Referring to FIG. 9, the connection bridge 423 connected to the core cylinder jacket 420 has a tube structure so that the outside of the plasma chamber 400 is operatively connected to the core storage space 427. The cooling water or cooling wind can be supplied to the core storage space 427 through the connection bridges 423. For this purpose, a cooling unit may be used. One of the two connection bridges 423 may be used for inputting/outputting the cooling water (or cooling wind).

As the method for securing the core cylinder jacket 420 inside the plasma chamber 400, both connection bridges 423 may be positioned on the core cylinder jacket 420 as shown in FIG. 9 but one connection bridge 423 may be positioned to be on the core cylinder jacket 420 and the other may be positioned to be under the core cylinder jacket 420 as shown in FIGS. 10 and 11. Although not shown in the drawings, the connection bridges 423 may be positioned at sidewalls of the plasma chamber 400 and the core cylinder jacket 420. The method for inputting/outputting the cooling water or cooling wind may vary depending on the methods for securing the core cylinder jacket 420.

In addition, the plasma chamber 400 and the core cylinder jacket 420 may be made of a conductive material, for example, aluminium. Or any one of the plasma chamber 400 and the core cylinder jacket 420 may be made of an insulating material, such as quartz. When the conductive material is used, preferably an anodized material may be used. When the conductive material is used for the plasma chamber 400 and the core cylinder jacket 420, it may be very useful to use a compound material, for example, the compound material resulted from the covalent bond of carbon nanotube and aluminium. The strength of the compound material is about three times that of conventional aluminium, and the weight thereof is light compared with the strength. When the plasma chamber 400 and the core cylinder jacket 420 are composed of the compound material, these can be maintained in the stable structure even in various process environments and thermal environments and the burden regarding the equipment, such as a large-volume plasma chamber, can be reduced.

Figure 12:
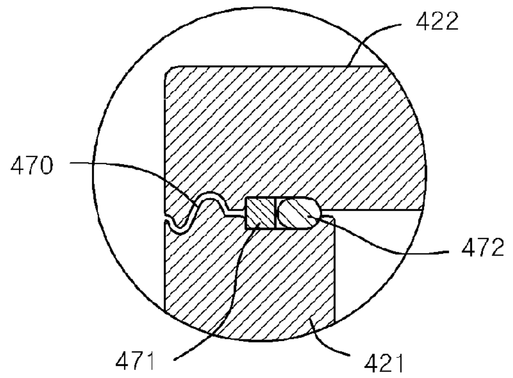
FIGS. 12 through 18 are views illustrating modified examples of the insulation structure of the core cylinder jacket.
Figure 13:
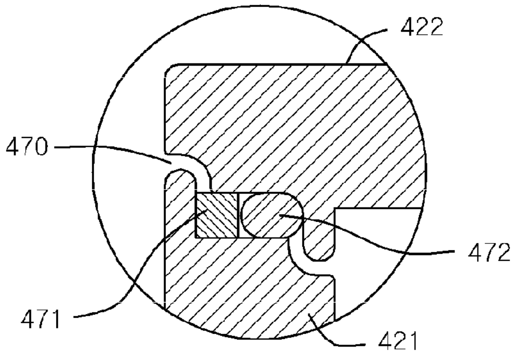
Figure 14:
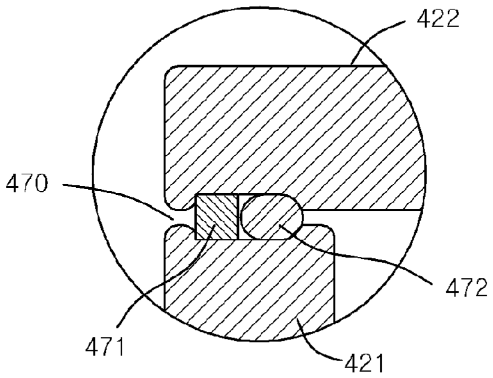
Figure 15:
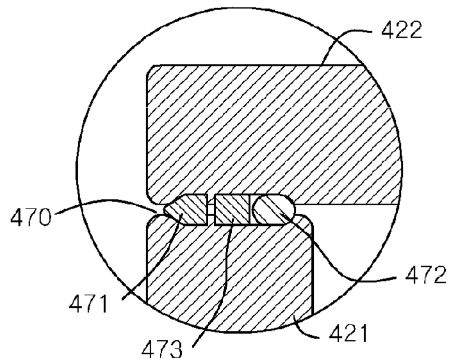
Figure 16:
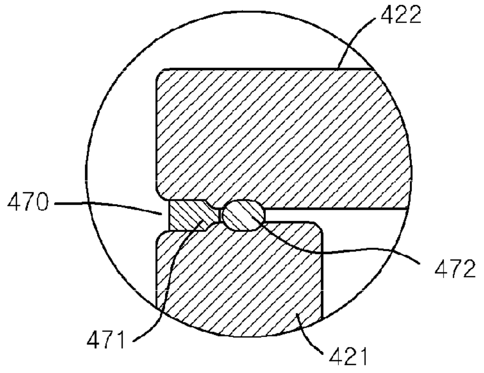
Figure 17:
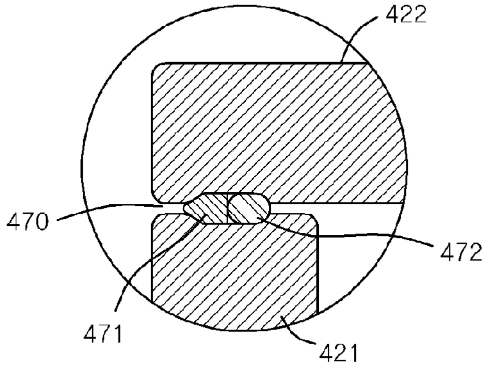
Figure 18:
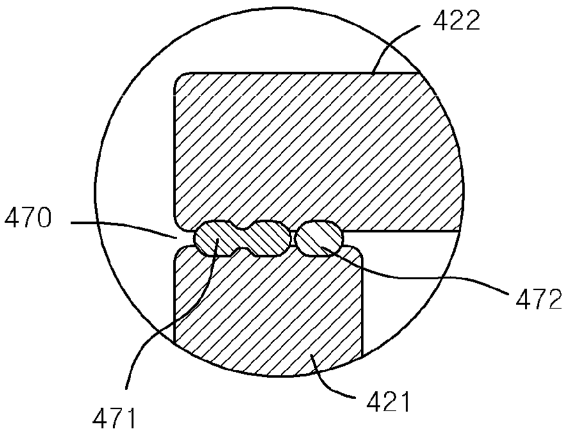

When the core cylinder jacket 420 is made of the conductive material, an eddy current may be induced at the plasma discharging. It is preferable to interrupt the eddy current because it decreases the energy transfer efficiency. Due to this reason, the core cylinder jacket 420 includes an electrically insulating region to have the electrical discontinuity. As one of the methods for forming the electrically insulating region, the jacket body 421 and the jacket cover 422 are combined together, spaced apart from each other by a gap 470 using an insulation ring 471. An O-ring 472 may be used for the vacuum insulation, together with the insulation ring 471. For effective electrical insulation and vacuum insulation, the structure of the gap 470 and the structure of the insulation ring 471 may vary as illustrated in FIGS. 12 through 18. For example, as illustrated in FIGS. 12 through 14, the insulation ring 471 may be square in its sectional structure. As illustrated in FIG. 15, two insulation rings 471 and 473 may be used. As illustrated in FIGS. 16 and 17, the insulation ring 471 may be wedge-shaped in any one direction in its sectional structure. Or as illustrated in FIG. 18, the insulation ring 471 may be irregular in its sectional structure. In addition to the various structures of the insulation rings 471, the sectional structure of the gap 470 may be various.

Figure 19:
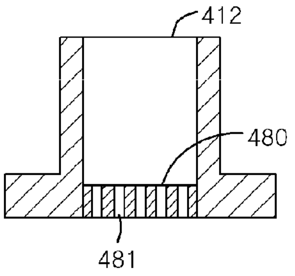
FIGS. 19 and 20 are views illustrating examples of the constitution of a porous gas intake plate in a gas inlet.
Figure 20:
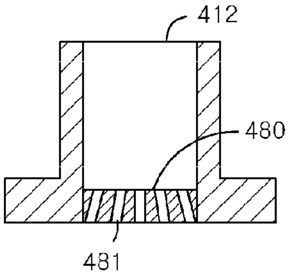

FIGS. 19 and 20 illustrate examples of using a porous gas intake plate 480 in the gas inlet 412.

Figure 21:
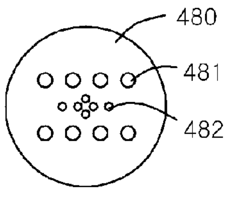
FIGS. 21 and 22 are plan views illustrating the porous gas intake plates.
Figure 22:
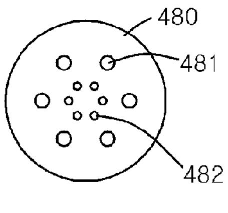

Referring to FIGS. 19 and 20, the gas inlet 412 of the plasma chamber 400 may include the porous gas intake plate 480. A number of pores 481 are formed to penetrate the gas intake plate 480. The penetrating pores 481 may be formed to be perpendicularly as illustrated in FIG. 19 or to have different slopes as illustrated in FIG. 20. The penetrating pores 481 may be arranged in a linear arrangement structure or a round arrangement structure as illustrated in FIG. 21 or 22, in which a number of fine pores 482 being smaller than the pores 481 may be additionally formed. The porous gas intake plate 480 evenly distributes the gas flowing into the plasma chamber 400 and uniformly mixes two or more different gases when these gases flow into the plasma chamber 400.

Figure 23:
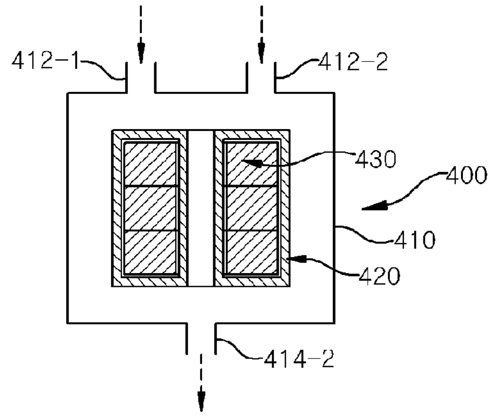
FIGS. 23 and 24 are views illustrating modified examples of the constitution of the gas inlet and gas outlet in the plasma chamber.
Figure 24:
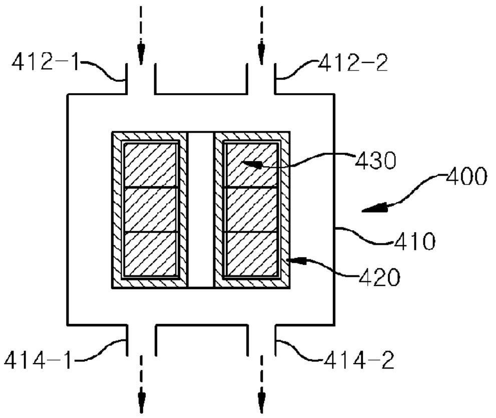

FIGS. 23 and 24 illustrate modified examples of forming a gas inlet and a gas outlet in the plasma chamber 400.

Referring to FIG. 23, the plasma chamber 400 may include two or more gas inlets 412-1 and 412-2 separated from each other. The two gas inlets 412-1 and 412-2 enable two or more different gases to be mixed to be supplied or to be separated to be supplied. For example, a reactive gas may be supplied through one (a first) gas inlet 412-1 and a noble gas may be supplied through the other (a second) gas inlet 412-2.

Referring to FIG. 24, the plasma chamber 400 may include two or more gas outlets 414-1 and 414-2 separated from each other. The two or more gas outlets 414-1 and 414-2 may separately supply the active gas, making a broad process space as a process chamber (for example, the process chamber having multi-station to simultaneously process two substrates to be processed).

Figure 25:
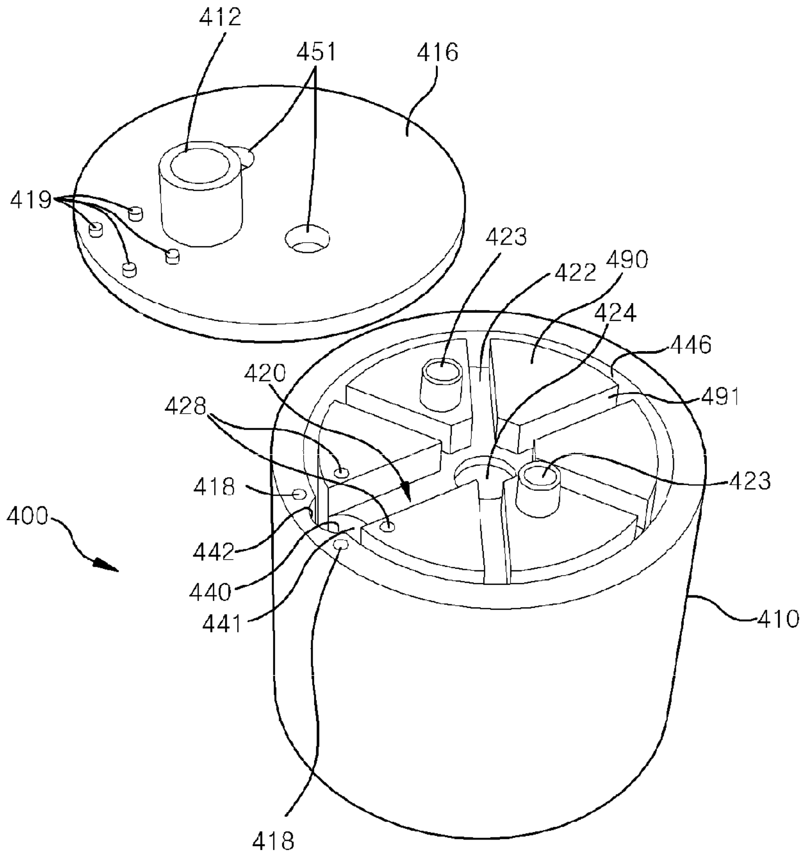
FIG. 25 is a view illustrating an example of including a discharging inducing block inside the plasma chamber.

FIG. 25 illustrates an example of including a discharging inducing block 490 inside the plasma chamber 400.

Referring to FIG. 25, the plasma chamber 400 may include one or more discharging inducing block 490. For example, a number of the discharging inducing blocks 490 may be installed to be spaced apart form each other, by a gap, on the core cylinder jacket 420, to form multiple discharging paths 491 in a radial shape. Although not shown, a number of the discharging inducing blocks 490 may be installed under the core cylinder jacket 420 in the same structure. The discharging inducing block 490 may be made of an insulating or conductive material.

Figure 26:
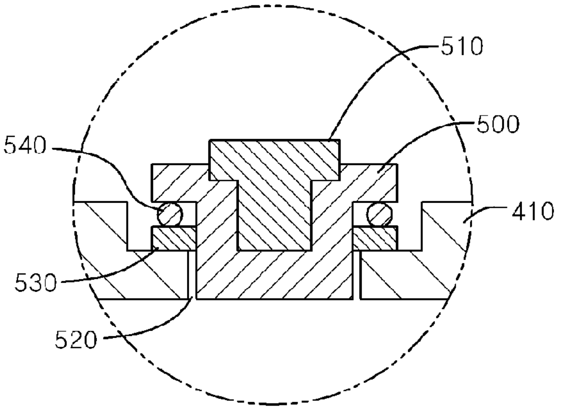
FIG. 26 is a view illustrating an example of an ignition electrode.

FIG. 26 illustrates an example of an ignition electrode 510.

Referring to FIG. 26, the chamber body 410 may include the ignition electrode 510 to generate free charges which assist the ignition of plasma. For example, an opening 520 is formed at a part of the chamber body 410, and the ignition electrode 510 is installed in the opening 520. The ignition electrode 510 and the chamber body 410 may be connected to each other by interposing an insulation cover 500 therebetween, to prevent the ignition electrode 510 and the chamber body 410 from being directly contacted with each other and to prevent the ignition electrode 510 from being directly exposed to the discharging space. Further, the ignition electrode 510 and the chamber body 410 may be connected to each other by interposing an insulation ring 530 and an O-ring 540, for vacuum and electrical insulation.

Figure 27:
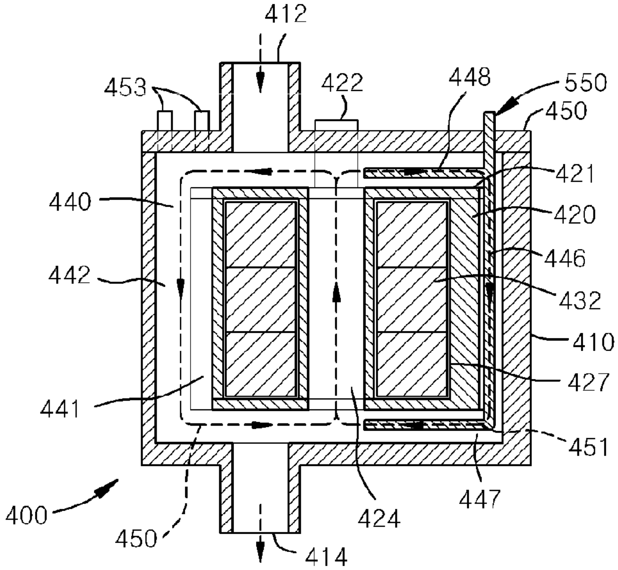
FIG. 27 is a view illustrating an example of an ignition maintenance electrode installed inside the plasma chamber.
Figure 28:
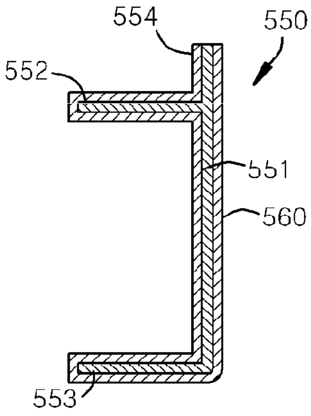
FIG. 28 is a view illustrating an insulation cover additionally formed on the ignition maintenance electrode of FIG. 27.

FIG. 27 illustrates an example of an ignition maintenance electrode 550 installed inside the plasma chamber 400, and FIG. 28 illustrates an example of adding an insulation cover to the ignition electrode 510 of FIG. 27.

Referring to FIG. 27, the ignition maintenance electrode 550 may be installed inside the plasma chamber 400. The ignition maintenance electrode 550 may be positioned in the plasma discharging space, and its shape may be bent along a plasma discharging path, for example, 'ㄷ'. In this structure, both ends 552 and 553 of the ignition maintenance electrode 550 are extended towards the through-aperture 424 of the core cylinder jacket 420. An extended part 554 of a corner part being bent at one side may be extended outwardly the plasma chamber 400, to be electrically connected to the ignition power (not shown). As illustrated in FIG. 28, the ignition maintenance electrode 550 may include a metal electrode 551 and an insulation cover 560 covering the metal electrode 551.

Figure 29:
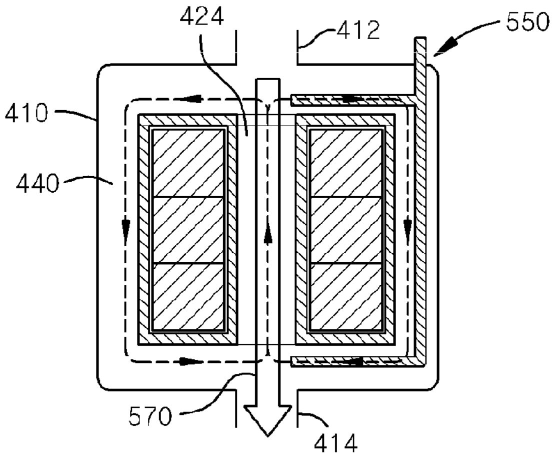
FIG. 29 is a view illustrating a flow of plasma concentrated inside the plasma chamber where the ignition maintenance electrode is installed.

Preferably, the ignition maintenance electrode 550 installed inside the plasma chamber 400 may be positioned in the plasma decentralized channel 452. Further, as illustrated in FIG. 29, in this structure, a more centralized plasma flow 57 is possible by aligning the gas inlet 412 and gas outlet 414 of the plasma chamber 400 with the through-aperture 424 of the core cylinder cover 430. Furthermore, the plasma inside the plasma chamber 400 is more stably maintained by the ignition maintenance electrode 550.

Figure 30:
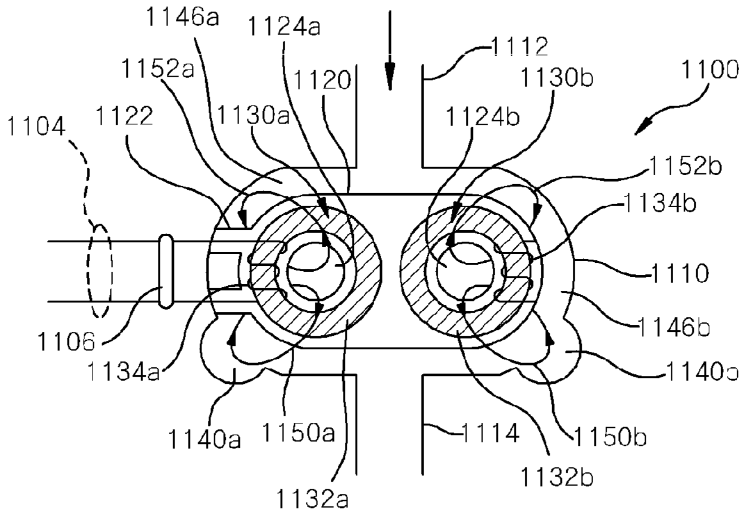
FIG. 30 is a concept view for explaining a plasma chamber with two internal transformers according to another embodiment of the present invention.

FIG. 30 is a concept view for explaining a plasma chamber 1110 with two transformers 1130a and 1130b according to another embodiment of the present invention.

Referring to FIG. 30, a plasma reactor 1100 according to another embodiment of the present invention comprise the plasma chamber 1110 in which the two transformers 1130a and 1130b are installed. The plasma chamber 1110 includes a gas inlet 1112 and a gas outlet 1114 and provides a plasma discharging space. A core cylinder jacket 1120 providing a core storage space is included inside the plasma chamber 1110. The core cylinder jacket 1120 is spaced apart from the plasma chamber 1110 by a gap and is connected to the plasma chamber 1110 through a connection bridge 1122. The core storage space of the core cylinder jacket 1120 is operatively connected to the outside of the plasma chamber 1110 through the connection bridge 1122. The two transformers 1130a and 1130b are installed in the core storage space of the core cylinder jacket 1120. The two transformers 1130a and 1130b each include magnetic cores 1132a and 1132b each having primary windings 1134a and 1134b. The magnetic cores 1132a and 1132b are each installed in the core storage space, surrounding two through-apertures 1124a and 1124b. The primary windings 1134a and 1134b are each extended to the outside of the plasma chamber 1110 through the connection bridges 1122 and electrically connected to a power supply unit (not shown) supplying radio frequency. The gas outlet 1114 of the plasma chamber 1110 is connected to a process chamber 300 through an adapter (not shown).

The core cylinder jacket 1120 includes the two through-apertures 1124a and 1124b and forms plasma centralized and decentralized channels 1150a and 1150b and 1152a and 1152b each passing through the through-apertures 1124a and 1124b in the plasma discharging space of the plasma chamber 1110. The plasma discharging space is divided into a number of spatial regions by the core cylinder jacket 1120. One is first spatial regions 1140a and 1140b to each form the plasma centralized channels 1150a and 1150b. The other is second spatial regions 1146a and 1146b to each form the plasma decentralized channels 1152a and 1152b. Each of the first spatial regions 1140a and 1140b includes a side of the plasma chamber 1110 and a side of the core cylinder jacket 1120, wherein the plasma chamber 1110 and the core cylinder jacket 1120 oppose to each other by a first gap. Each of the second spatial regions 1146a and 1146b includes another side of the plasma chamber 1110 and another side of the core cylinder jacket 1120, wherein the plasma chamber 1110 and the core cylinder jacket 1120 oppose to each other by a second gap. The first gap has a greater value than the second gap. Further, the inner diameter each of the through-apertures 1124a and 1124b has a greater value than the second gap. The plasma centralized channels 1150a and 1150b and the plasma decentralized channels 1152a and 1152b share the through-apertures 1124a and 1124b of the core cylinder jacket 1120.

The plasma reactor 1100 is almost same as the plasma reactor 100 with one transformer with respect to the constitution and operation structure. Therefore, no further description of the same constitution and operation will be presented. The differences between the plasma reactor 1100 and the plasma reactor 100 are that the core cylinder jacket 1120 has the two transformers 1130a and 1130b and includes the two through-apertures 1124a and 1124b. However, the plasma reactor 1100 and the plasma reactor 100 are basically same as each other in the structure of forming the plasma centralized channels 1150a and 1150b each passing through the first spatial regions 1140a and 1140b and the plasma decentralized channels 1152a and 1152b each passing through the second spatial regions 1146a and 1146b in the plasma discharging space inside the plasma chamber.

In the plasma reactor 1100, since energy is transferred with almost no loss of the energy from the two transformers 1130a and 1130b installed inside the plasma chamber 1110 to the plasma discharging space, the efficiency of transferring the energy is very high. Consequently, the plasma reactor 1100 is very suitable for generating a large amount of active gas. Specifically, since the two transformers 1130a and 1130b are used, the plasma reactor 1100 is capable of generating a relatively large amount of the active gas. Furthermore, the plasma reactor 1100 can be effectively used when supplying the active gas into the process chamber through a number of gas outlets. Or since the plasma reactor 1100 uses a number of low-capacity transformers, it is capable of avoiding many problems that may be caused when one high-capacity transformer is used.

Figure 31:
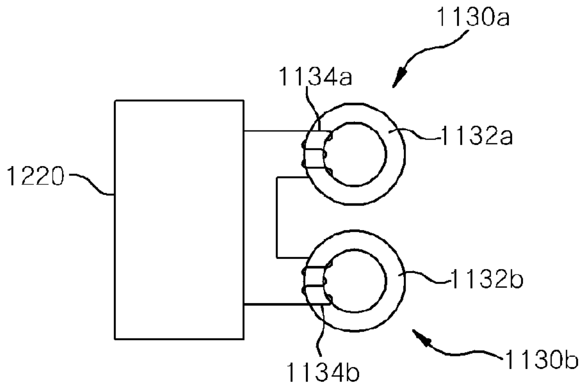
FIGS. 31 through 33 are view illustrating various structures of electrical connection of two transformers.
Figure 32:
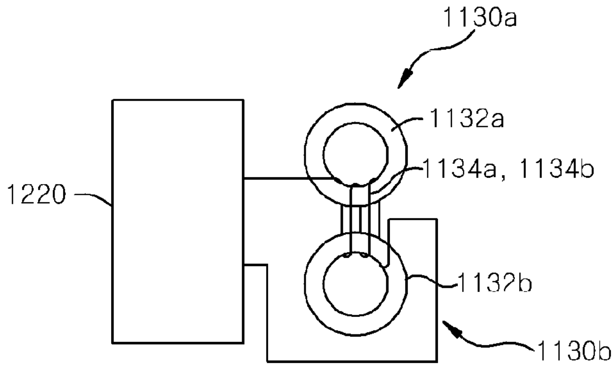
Figure 33:
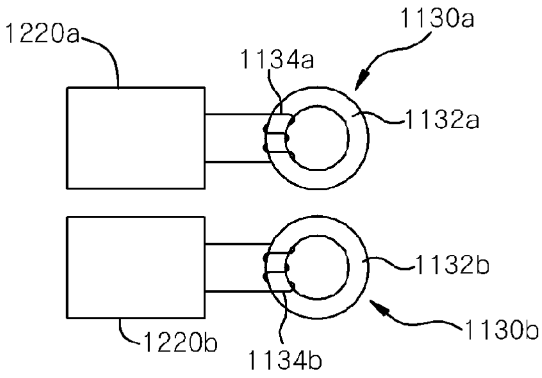

FIGS. 31 through 33 illustrate various structures of electrically connecting the two transformers 1130*a* and 1130*b* to each other.

The two transformers 1130*a* and 1130*b* can be driven in various ways. For example, as illustrated in FIG. 31, the two transformers 1130*a* and 1130*b* may be connected to one AC switching power supply source 1220 in series or in parallel to be driven. As illustrated in FIG. 32, the two transformers 1130*a* and 1130*b* may be connected to one AC switching power supply source 1220 in the manner that the primary windings 1134*a* and 1134*b* are wound about the two magnetic cores 1132*a* and 1132*b* in common. Or as illustrated in FIG. 33, the two transformers 1130*a* and 1130*b* may be driven in parallel, by using two AC switching power supply sources 1220*a* and 1220*b*. Then, a common clock circuit may be used to synchronize the phases of the two AC switching power supply sources 1220*a* and 1220*b*.

Figure 34:
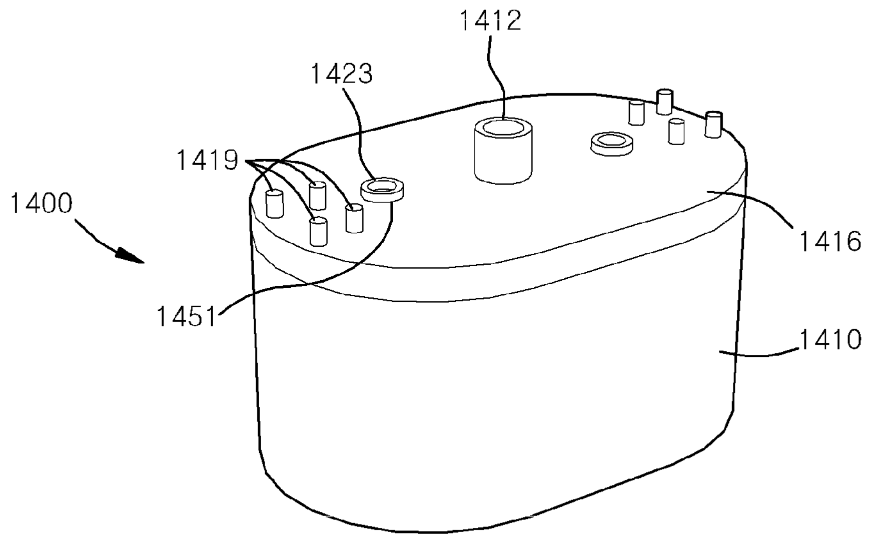
FIG. 34 is a perspective view illustrating a plasma chamber with two internal transformers according to a modified example of the embodiment of FIG. 30.
Figure 35:
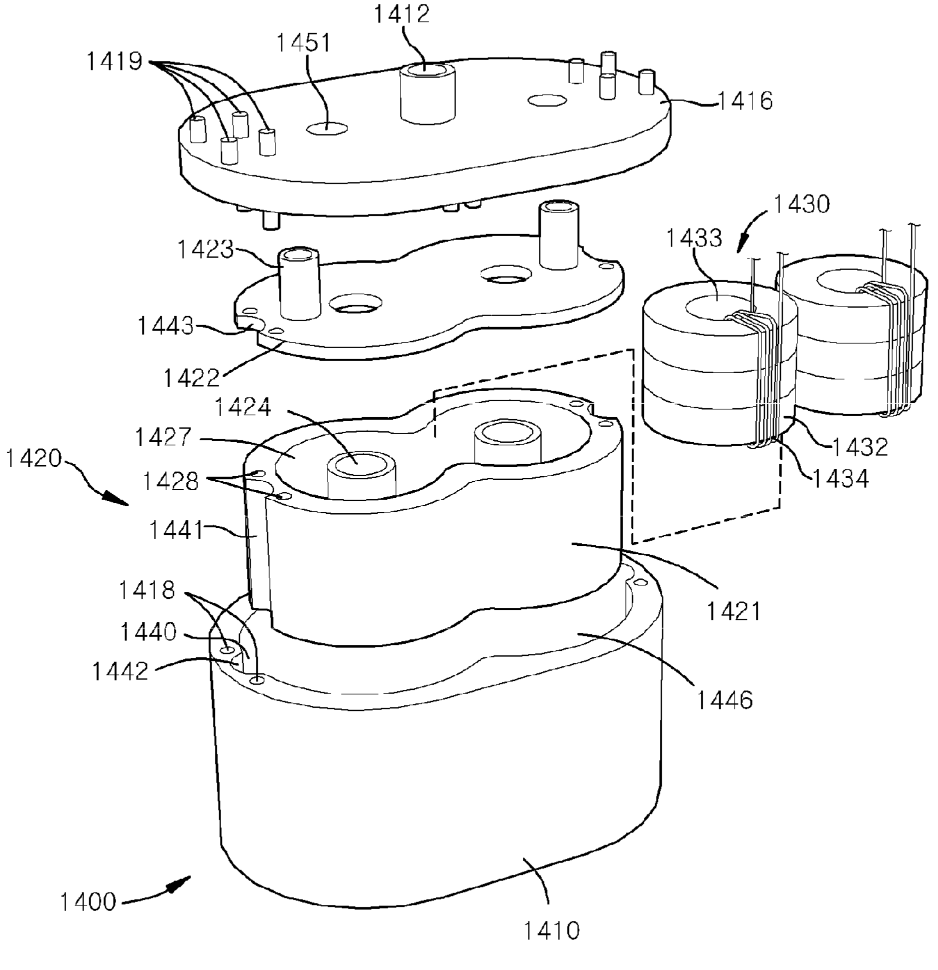
FIG. 35 is an exploded perspective view illustrating the main constitution of the plasma chamber of FIG. 34.

FIG. 34 is a perspective view of a plasma chamber 1400 with two internal transformers 1410 according to a modified example of the embodiment of FIG. 30, and FIG. 35 is an exploded perspective view of the main constitution of the plasma chamber 1400 of FIG. 34.

Referring to FIGS. 34 and 35, the plasma chamber according to another embodiment of the present invention comprises a chamber body 1410 providing the plasma discharging space, and a chamber cover 1416. The chamber body 1410 and the chamber cover 1416 are combined together vacuum-insulated by an O-ring (not shown). Since the plasma chamber 1400 has the structure in which the two transformers 1430 are installed, even though the chamber body 1410 and the chamber cover 1416 are made by using a metal material, there is no need to constitute an additional insulating region. A gas inlet 1412 is formed in the chamber cover 1416 and a gas outlet 1414 (not shown) is formed at the bottom of the chamber body 1410. Two bridge connection openings 1451 to be combined with connection bridges 1423 of a core cylinder jacket 1420 are formed in the chamber cover 1416.

The core cylinder jacket 1420 is installed inside the plasma chamber 1400. The core cylinder jacket 1420 includes a jacket body 1421 and a jacket cover 1422. The jacket body 1421 and the jacket cover 1422 are combined together to form vacuum and to be electrically insulated by an O-ring (not shown) and an insulation ring (not shown). When the core cylinder jacket 1420 is made of a conductive material, the insulation ring (not shown) performs the function of an insulating region having the electric discontinuity, to interrupt the generation of an eddy current in the core cylinder jacket 1420. The jacket body 1421 includes two through-apertures 1424 penetrating a core storage space 1427 vertically. A magnetic core 1432 forming each of the two transformers 1430 is installed in the manner that each core opening 1433 receives each through-aperture 1424.

The core cylinder jacket 1420 includes one or more than one connection bridges 1423. For example, two connection bridges 1423 are formed in the jacket cover 1422, and the connection bridges 1423 are each connected to the bridge connection openings 1451 formed in the chamber cover 1416. The two connection bridges 1423 and the two bridge connection openings 1451 are each vacuum-insulated by the O-ring (not shown). The two connection bridges 1423 keep the core cylinder jacket 1420 in the plasma discharging space inside the plasma chamber 1400 while maintaining a predetermined gap. The two connection bridges 1423 each have a tube structure so that the outside of the plasma chamber 1400 is operatively connected to the core storage space 1427. Primary winding 1434 in each of the two transformers 1430 is extended to the outside of the plasma chamber 1400, through each connection bridge 1423, so as to be electrically connected to a power supply source (not shown).

Figure 36:
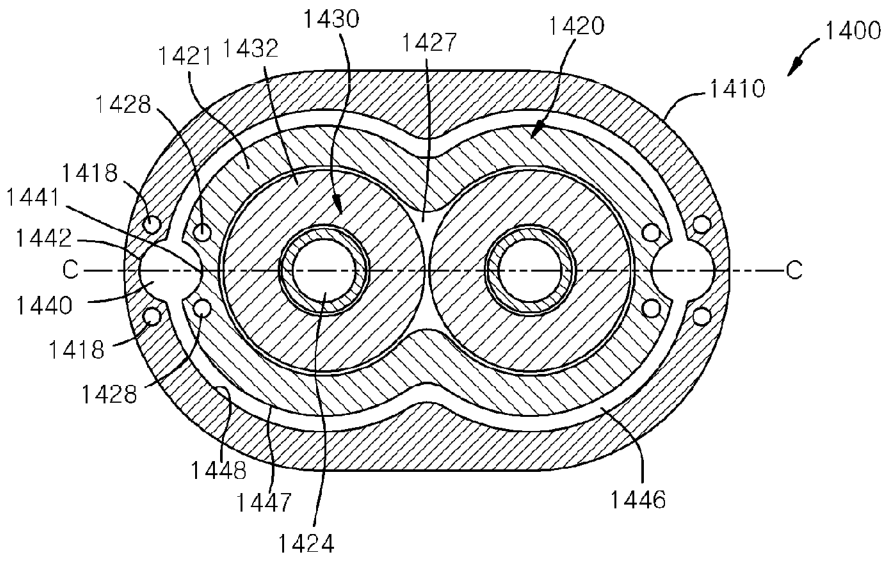
FIG. 36 is a horizontal sectional view illustrating the plasma chamber of FIG. 34.
Figure 37:
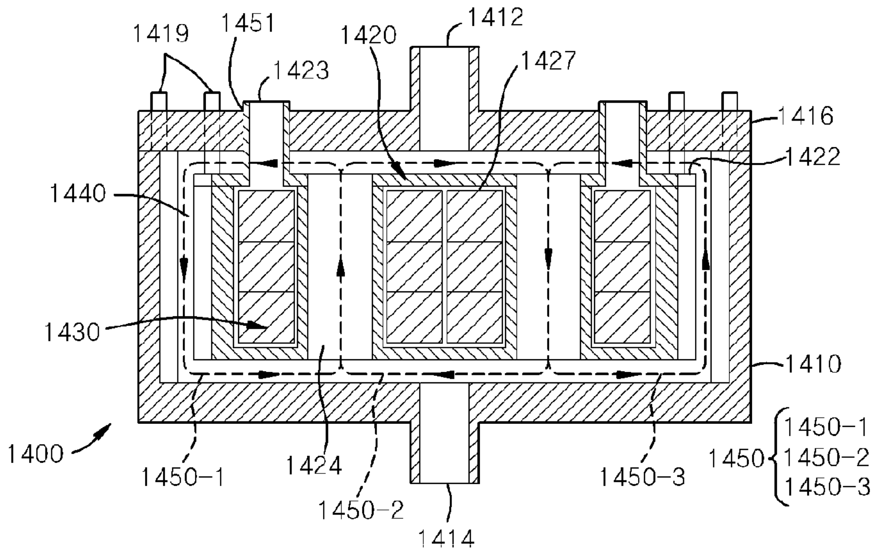
FIG. 37 is a vertical sectional view of the plasma chamber, taken along line C-C of FIG. 36.

FIG. 36 is a plan sectional view of the plasma chamber 1400 of FIG. 34, and FIG. 37 is a vertical sectional view of the plasma chamber 1400, taken along line C-C of FIG. 36.

Referring to FIGS. 36 and 37, the core cylinder jacket 1420 is installed to be spaced apart from the inner surface of the plasma chamber 1400 by a gap, thereby forming a plasma centralized channel 1450 and a plasma decentralized channel (not shown) which pass through the two through-apertures 1424 in the plasma discharging space. The plasma discharging space is divided into two spatial regions by the core cylinder jacket 1420. One is a first spatial region 1440 for forming the plasma centralized channel 1450 and the other is a second spatial region 1446 for forming the plasma decentralized channel (not shown in FIG. 37).

The first spatial region 1440 for forming the plasma centralized channel 1450 includes a side 1442 of the plasma chamber 1400 and a side 1441 of the core cylinder jacket 1420, wherein the plasma chamber 1400 and the core cylinder jacket 1420 oppose to each other by a first gap. The side 1442 of the plasma chamber 1400 and the side 1441 of the core cylinder jacket 1420 form the first spatial region 1440 in an overall cylindrical structure which is hollow. The first gap of the first spatial region 1440 (which is substantially the inner diameter of the hollow cylindrical structure) may be formed to be same as or smaller than the inner diameter of the through-aperture 1424 of the core cylinder jacket 1420. The plasma centralized channel 1450 is formed by passing through the first spatial region 1440 and the through-aperture 1424.

Specifically, in the structure in which the two transformers 1430 are mounted, a plasma centralized channel 1450-2 passing through the two through-apertures 1424 may be formed, along the direction in which the primary winding (not shown) is wound. That is, the plasma centralized channel 1450 may include two plasma centralized channels 1450-1 and 1450-3 passing through the two first spatial regions 1440 and the two through-apertures 1424, and another plasma centralized channel 1450-2 passing through only the two through-apertures 1424.

The second spatial space 1446 to form the plasma decentralized channel (not shown in FIG. 37) includes another side 1448 of the plasma chamber 1400 and another side 1447 of the core cylinder jacket 1420, wherein the plasma chamber 1400 and the core cylinder jacket 1420 oppose to each other by a second gap. The second gap has a smaller value than the first gap. The plasma decentralized channel is formed by passing through the two second spatial regions 1446 and the two through-apertures 1424. The two second spatial regions 1446 substantially correspond to the rest excluding the two first spatial regions 1440 from the inside wall of the plasma chamber 1400 and the outside wall of the core cylinder jacket 1420.

Since the gap of the second spatial region 1446 is relatively narrower than that of the first spatial region 1440, most of a gas substantially flows through the first spatial region 1440 and the through-aperture 1424 inside the plasma chamber 1400, and most of an active gas is generated in the plasma centralized channel 1450. Preferably, cooling channels 1418 and 1428 may be formed around the first spatial regions 1440 forming the plasma centralized channels but the cooling channels may be formed at any other positions if needed.

FIGS. 38 through 44 are various modified examples illustrating the structure of the plasma chamber.

Figure 38:
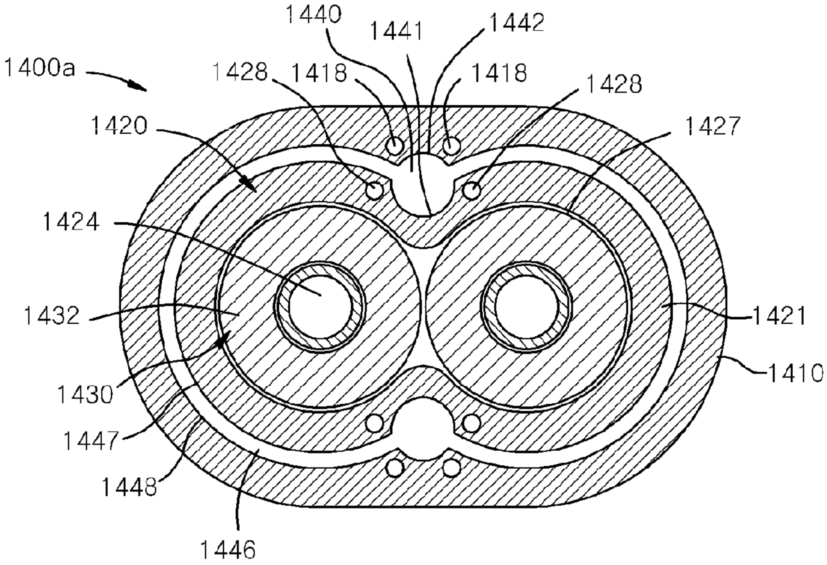
FIGS. 38 through 44 are view illustrating various modified examples of the plasma chambers.
Figure 39:
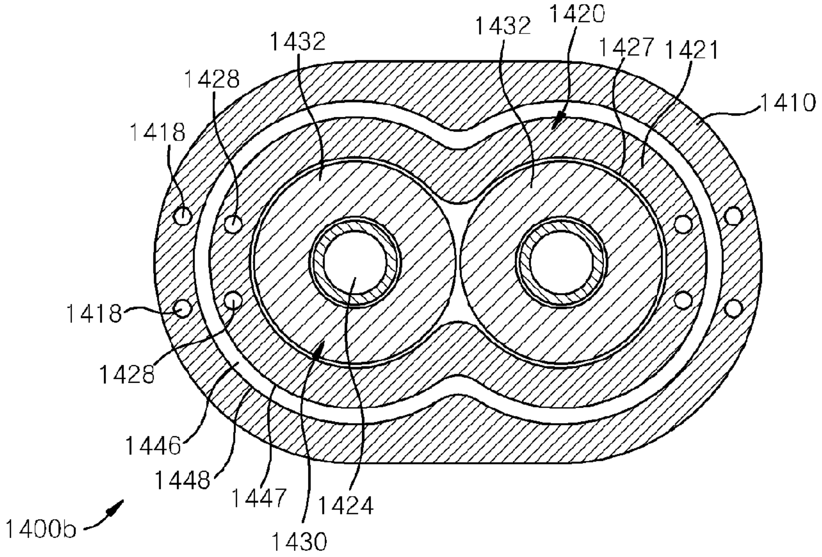

Referring to FIG. 38, a plasma chamber 1400*a* according to a modified embodiment may have the structure in that two first spatial regions 1440 and two through-apertures 1424 are arranged to cross over each other. Or as illustrated in FIG. 39, another plasma chamber 1400*b* according to another modified embodiment may have the structure in that the plasma centralized channel is formed using only two through-apertures 1424.

Figure 40:
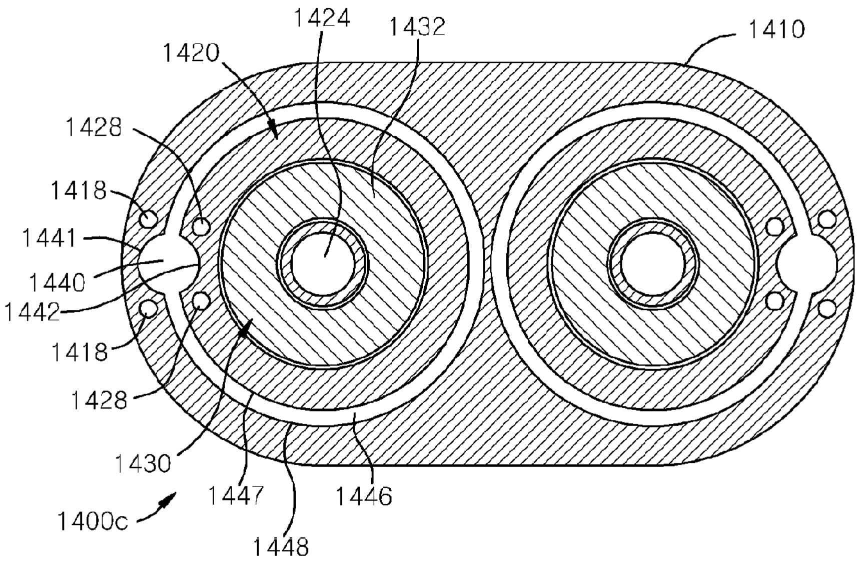
Figure 41:
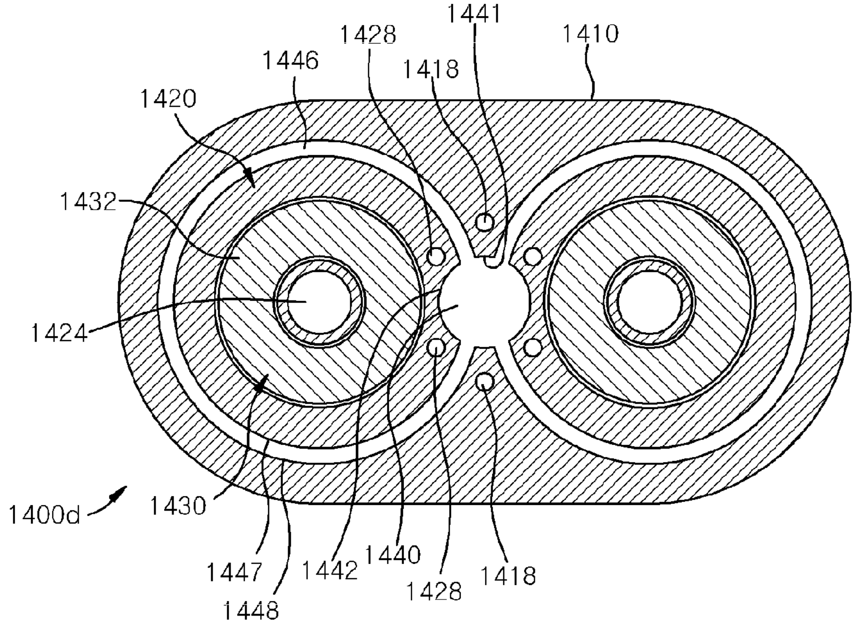

Referring to FIG. 40, another plasma chamber 1400*c* according to another modified embodiment may include two core cylinder jackets 1420 each having one transformer 1430. Each of two core cylinder jackets 1420 independently forms the first spatial region 1440 and the second spatial region 1446. Or as illustrated in FIG. 41, another plasma chamber 1400*d* according to another modified embodiment includes two core cylinder jackets 1420 each having one transformer 1430 but forming one common first spatial region 1440 and each independent second spatial region 1446.

Figure 42:
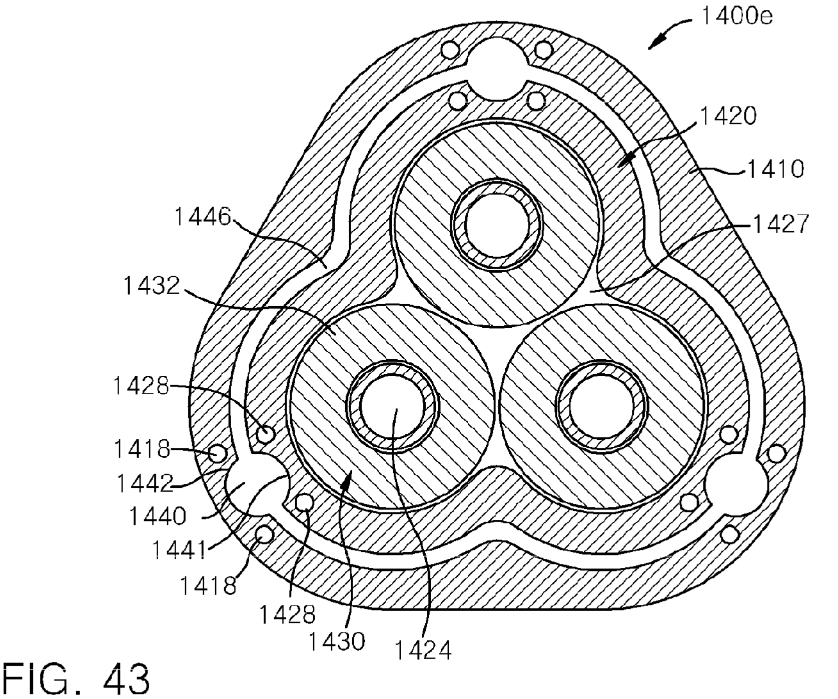
Figure 43:
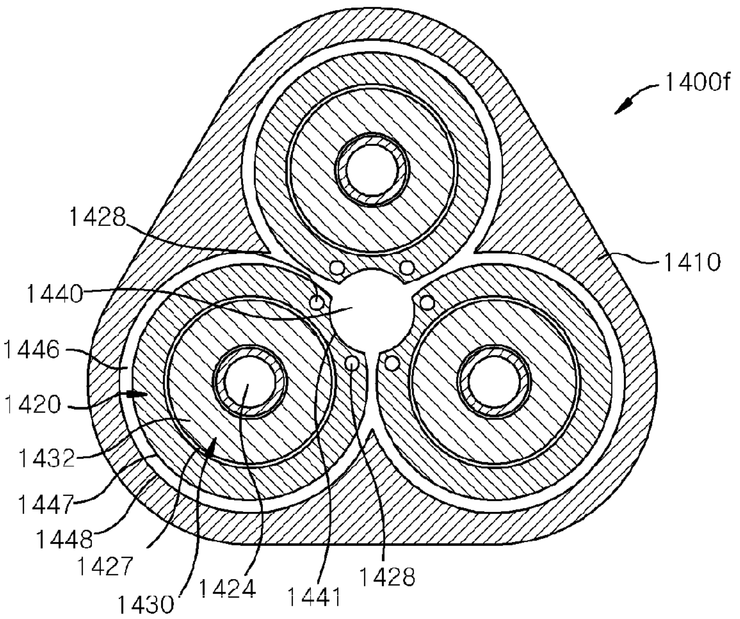
Figure 44:
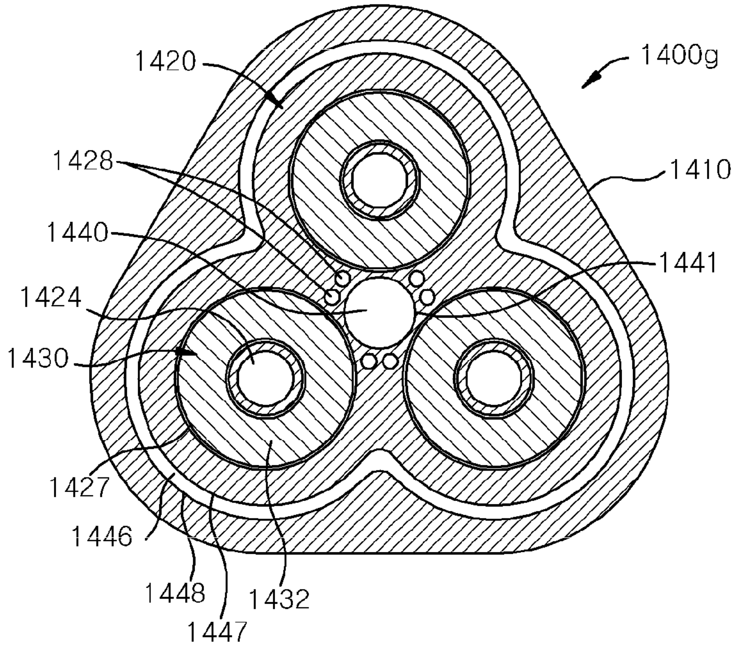

FIGS. 42 through 44 are various modified examples illustrating the plasma chamber with three internal transformers.

As illustrated in FIGS. 42 through 44, each of plasma chambers 1400*e*, 1400*f* and 1400*g* according to other modified embodiments comprises three internal transformers 1430. As illustrated in FIG. 42, in the plasma chamber 1400*e*, the three transformers 1430 are installed in one core cylinder jacket 1420. As illustrated in FIG. 43, in the plasma chamber 1400*f*, the three transformers 1430 may be separately and independently installed in three core cylinder jackets 1420. Or as illustrated in FIG. 44, the plasma chamber 1400*g* comprises one core cylinder 1420 including three separate core storage spaces 1427, three through-apertures 1424 and other through-apertures 1428.

In the modified examples, one or more first spatial regions 1440 to form the plasma centralized channel may be structured to be variously arranged. Accordingly, one or more second spatial regions 1446 to form the plasma decentralized channel may have various arrangement structures. Specially, the plasma centralized channel may be formed by using only two or more through-apertures 1424 included in the core cylinder jacket 1420.

The plasma reactor having the internal transformer according to the present invention is usefully applied to the process of processing various materials, such as solid, powder, gas and the like, and the process of cleaning a process chamber in the semiconductor processing equipment, such as etching or vapour deposition. Further, the plasma reactor having the internal transformer can be used as an apparatus for gas separation, an active gas source or a reactive gas source. Further, the plasma reactor having the internal transformer can be used as an ion source for ion implantation or ion milling. Further, the plasma reactor having the internal transformer can be used as an atmospheric pressure plasma torch.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A plasma reactor comprising:

a plasma chamber with a gas inlet and a gas outlet, for providing a plasma discharging space;

a core cylinder jacket including a through-aperture, for providing a core storage space in the plasma chamber and for dividing the plasma discharge space into a first spatial region that includes a first inner wall of the plasma chamber and a first outer lateral side of the core cylinder jacket which oppose each other and are spaced apart by a first gap to form a plasma centralized channel, and a second spatial region that includes a second inner wall of the plasma chamber and a second outer lateral side of the core cylinder jacket which oppose each other and are spaced apart by a second outer form plasma decentralized channel such that the first gap has a greater value than the second gap, an inner diameter of the through-aperture has a greater value than the second gap and the plasma centralized channel and the plasma decentralized channel share the through-aperture; and one or more transformers each including a magnetic core with primary winding surrounding the through-aperture and installed in the core storage space.

2. The plasma reactor according to claim 1, wherein the first spatial region and the second spatial region comprises a spacer block between the first and second spatial regions.

3. The plasma reactor according to claim 1, wherein the plasma chamber comprises a cooling channel.

4. The plasma reactor according to claim 1, wherein the core cylinder jacket comprises a cooling channel.

5. The plasma reactor according to claim 1, further comprising:

one or more than one connection bridges in a tube structure connected between the plasma chamber and the core cylinder jacket, for operatively connecting the outside of an plasma chamber to the core storage space.

6. The plasma reactor according to claim 5, further comprising:

a cooling unit for supplying cooling water or cooling wind to the core storage space through the one or more than one connection bridges.

7. The plasma reactor according to claim 1, further comprising:

one or more discharging inducing blocks positioned between the plasma chamber and the core cylinder jacket, for defining the plasma centralized channel and the plasma decentralized channel within the plasma discharging space.

8. The plasma reactor according to claim 1, wherein the core cylinder jacket and the plasma chamber are composed of a conductive material but electrically insulated from each other, and as the one or more transformers are driven with the plasma chamber, which is electrically grounded the core cylinder jacket and the plasma chamber generate a potential difference.

9. The plasma reactor according to claim 1, further comprising:

an ignition electrode for generating free charges assisting an ignition of plasma toward the plasma discharging space.

10. The plasma reactor according to claim 1, further comprising:

an ultraviolet source optically connected to the plasma discharging space, for generating free charges assisting an ignition of plasma.

11. The plasma reactor according to claim 1, further comprising:

an ignition maintenance electrode positioned in the plasma discharging space, for generating free charges assisting an ignition and maintenance of plasma.

12. The plasma reactor according to claim 1, further comprising:

one or more switching semiconductor devices; and an AC switching power supply source for generating radio frequency and supplying the radio frequency to the one or more than one transformers.

13. The plasma reactor according to claim 12, wherein the one or more switching semiconductor devices comprise one or more switching transistors.

14. The plasma reactor according to claim 12, wherein the AC switching power supply source drives the one or more transformers in series or in parallel.

15. The plasma reactor according to claim 12, further comprising:

a measurement circuit for measuring an electrical or optical parameter value related to at least one of a primary winding of the one or more transformers and the plasma generated inside the plasma discharging space; and a power control circuit for controlling a voltage and a current supplied to the primary winding of the one or more transformers, by controlling an operation of the AC switching power supply source based on the electrical or optical parameter value measured by the measurement circuit.

16. The plasma reactor according to claim 1, further comprising:

one or more switching semiconductor devices; and two or more AC switching power supply sources for generating radio frequency and supplying the radio frequency to their corresponding one of the one or more transformers.

17. The plasma reactor according to claim 16, wherein the one or more switching semiconductor devices comprise one or more switching transistors.

18. The plasma reactor according to claim 16, further comprising:

a measurement circuit for measuring an electrical or optical parameter value related to at least one of a primary winding of the one or more transformers and the plasma generated inside the plasma discharging space; and a power control circuit for controlling a voltage and a current supplied to the primary winding of the one or more transformers, by controlling an operation of the AC switching power supply source based on the electrical or optical parameter value measured by the measurement circuit.

19. The plasma reactor according to claim 1, wherein the gas inlet comprises two or more separate gas inlets.

20. The plasma reactor according to claim 19, wherein the two or more separate gas inlets are a first gas inlet for supplying a reactive gas and a second gas inlet for supplying a noble gas.

21. The plasma reactor according to claim 1, further comprising:

a porous gas intake plate positioned at the gas inlet, for distributing a gas to flow into the plasma chamber.

22. The plasma reactor according to claim 1, wherein the gas outlet comprises two or more separate gas outlets.

23. The plasma reactor according to claim 1, wherein the gas inlet and the gas outlet are structured to be aligned toward the plasma centralized channel.

24. The plasma reactor according to claim 1, wherein the core cylinder jacket is composed of a conductive material but includes one or more electrically insulating region to form electrical discontinuity within the conductive material.

25. The plasma reactor according to claim 1, wherein at least one of the plasma chamber and the core cylinder jacket is composed of a conductive material.

26. The plasma reactor according to claim 25, wherein the conductive material comprises aluminum.

27. The plasma reactor according to claim 25, wherein the conductive material comprises a compound having a covalent bond between a carbon nanotube and aluminum.

28. The plasma reactor according to claim 1, wherein at least one of the plasma chamber and the core cylinder jacket is composed of an insulating material.

29. The plasma reactor according to claim 28, wherein the insulating material includes quartz.

30. The plasma reactor according to claim 1, further comprising:

a process chamber for receiving plasma generated in the plasma chamber; and an adapter connected between a plasma inlet of the process chamber and the gas outlet of the plasma chamber.

31. The plasma reactor according to claim 30, further comprising:

a cooling channel mounted inside the adapter.

32. The plasma reactor according to claim 30, wherein the adapter comprises one or more gas inlets not passing through the plasma chamber.

33. The plasma reactor according to claim 30, wherein the adapter comprises a window for measuring an optical parameter of plasma.

34. The plasma reactor according to claim 30, further comprising:

a diffuser positioned under the plasma inlet inside the process chamber, for diffusing plasma flowing into the plasma chamber.

35. The plasma reactor according to claim 30, further comprising:

a baffle plate positioned under the plasma inlet inside the process chamber, for diffusing the plasma flowing into the plasma chamber.

36. The plasma reactor according to claim 1, further comprising:

a power supply unit for supplying radio frequency to drive the one or more than one transformers, and wherein the power supply unit is structured to be physically separated from the plasma chamber, and a power output terminal of the power supply unit and a power input terminal connected to primary windings of the one or more than one transformers are remotely connected by a radio frequency supply cable.

* * * * *